(12) United States Patent
Lung et al.

(10) Patent No.: US 9,977,094 B2
(45) Date of Patent: May 22, 2018

(54) ISLANDING OPERATION DETECTION AND ISLANDING OPERATION DETECTION METHOD

(71) Applicant: Tabuchi Electric Co., Ltd., Yodogawa-ku, Osaka (JP)

(72) Inventors: Chienru Lung, Osaka (JP); Hideki Hidaka, Osaka (JP)

(73) Assignee: Tabuchi Electric Co., Ltd., Osaka (JP)

(*) Notice: Subject to any disclaimer, the term of this patent is extended or adjusted under 35 U.S.C. 154(b) by 0 days. days.

(21) Appl. No.: 15/401,355

(22) Filed: Jan. 9, 2017

(65) Prior Publication Data
US 2017/0269168 A1  Sep. 21, 2017

(30) Foreign Application Priority Data

Mar. 18, 2016  (JP) .................................. 2016-055457

(51) Int. Cl.
| | |
|---|---|
| *G01R 19/06* | (2006.01) |
| *G01R 23/00* | (2006.01) |
| *H02J 3/18* | (2006.01) |
| *G01R 31/40* | (2014.01) |
| *H02J 3/38* | (2006.01) |

(52) U.S. Cl.
CPC ............. *G01R 31/40* (2013.01); *H02J 3/18* (2013.01); *H02J 3/383* (2013.01); *H02J 2003/388* (2013.01)

(58) Field of Classification Search
CPC .... G01R 23/00; G01R 31/2612; G01R 19/00; G01R 19/06; G01R 19/0084; G01R 31/40; H02J 3/18; H02J 3/38; H02J 3/383; H02J 3/385; H02J 2003/388; H02J 3/44; H02J 3/46; H03L 5/00; H03L 5/02; H03L 7/00
See application file for complete search history.

(56) References Cited

FOREIGN PATENT DOCUMENTS

| JP | 2015-23653 A | 2/2015 |
|---|---|---|
| JP | 2015-223037 A | 12/2015 |

OTHER PUBLICATIONS

"The Standard of The Japan Electrical Manufacturers' Association", JEM 1498, Aug. 27, 2012, 23 pages, with partial English translation.

*Primary Examiner* — Son Le
(74) *Attorney, Agent, or Firm* — Crowell & Morring LLP

(57) ABSTRACT

An islanding operation detection device for a distributed power supply comprising an inverter connected to a commercial system power supply comprises: a commercial system frequency measurement circuitry; a reactive power injection amount calculation circuitry to calculate an amount of reactive power injection; a feedback signal generation circuitry; a reactive current control circuitry to feedback-control an output current command value to the inverter; an output current control circuitry to update the reactive current command value when a phase angle of the commercial system voltage is in the range of $90N°\pm\Delta\varphi$ so as to control an output current value of the inverter to follow the output current command value; and an islanding operation detection circuitry to detect whether or not the distributed power supply is in islanding mode, based on a commercial system frequency when the reactive power corresponding to the calculated amount of reactive power injection is injected.

7 Claims, 16 Drawing Sheets

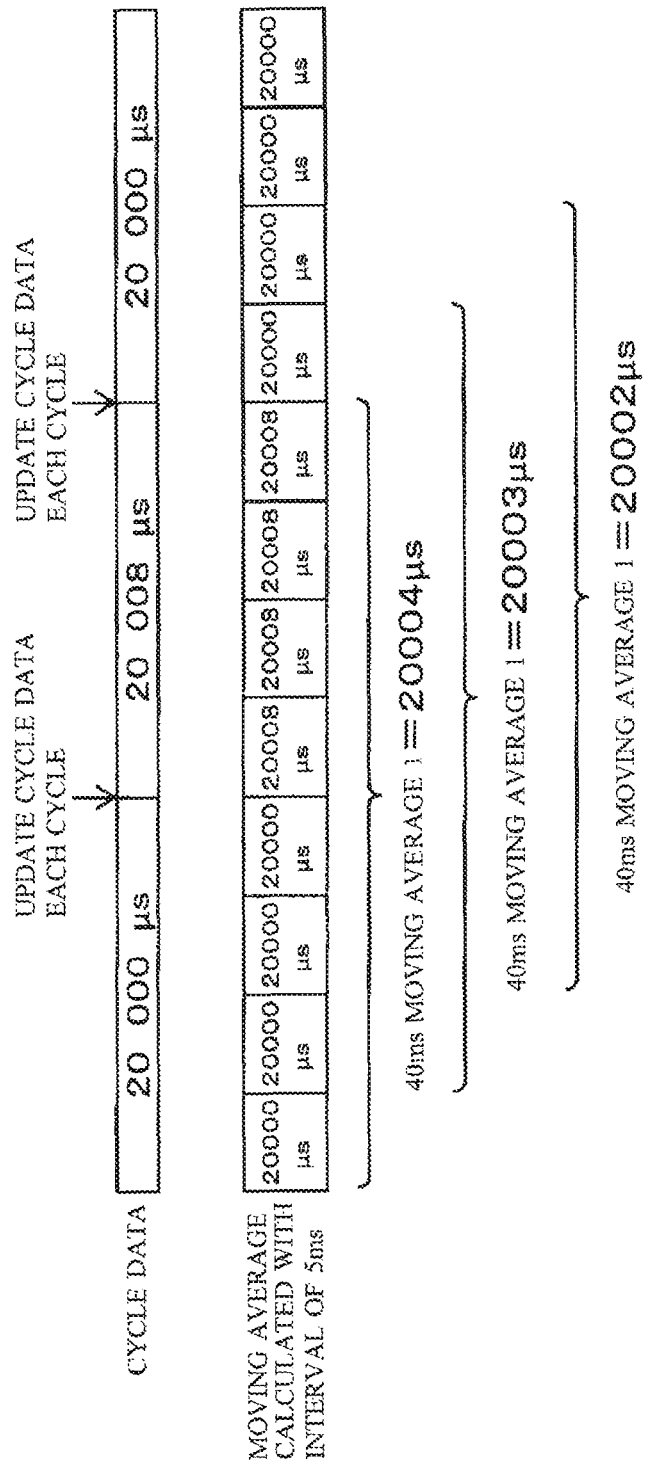

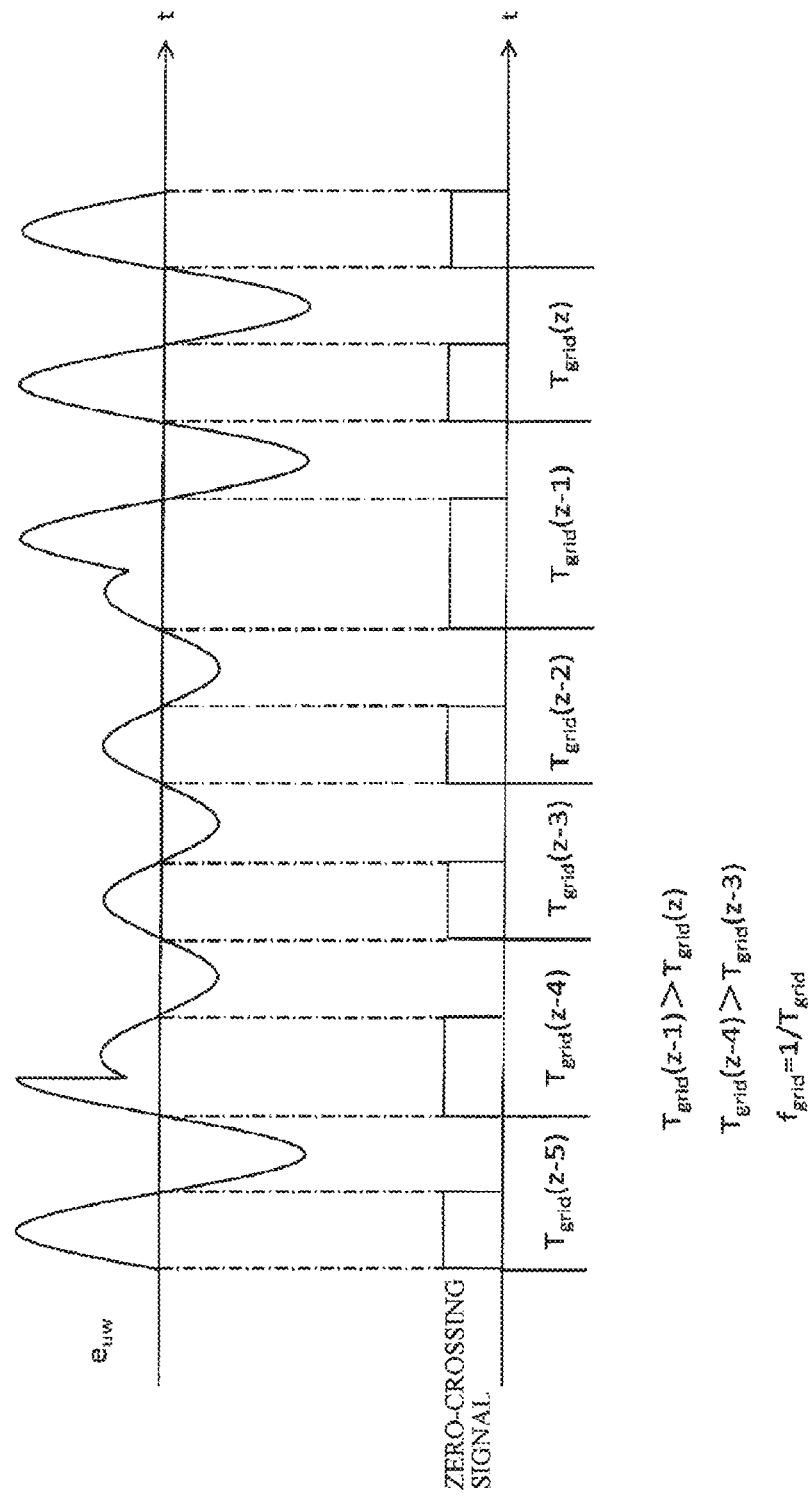

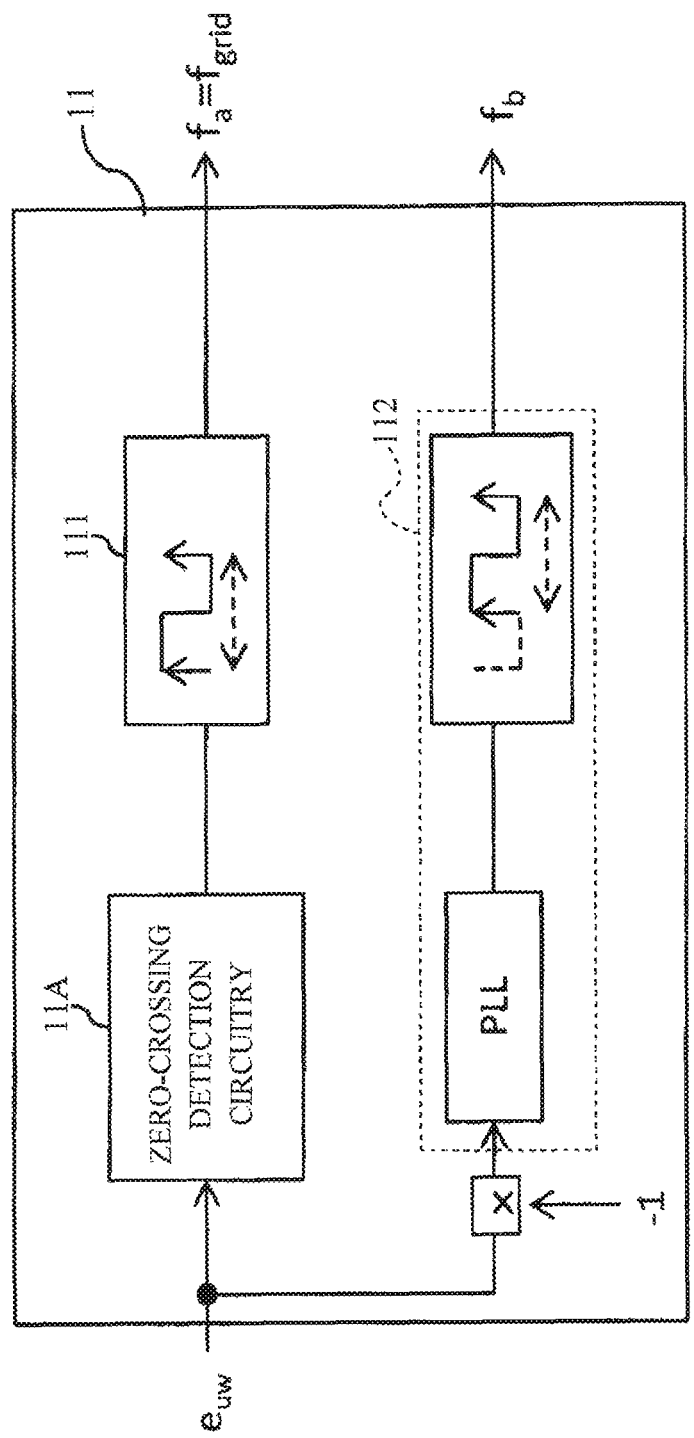

ISLANDING OPERATION DETECTION AND ISLANDING OPERATION DETECTION METHOD

CROSS-REFERENCE TO RELATED APPLICATION

This application is based on and claims the benefit of priority of the prior Japanese Patent Application No. 2016-055457, filed on Mar. 18, 2016, the entire contents of which are incorporated herein by reference.

BACKGROUND OF THE INVENTION

1. Field of the Invention

The present invention relates to an islanding operation detection device and an islanding operation detection method for a distributed power supply comprising an inverter grid-connected to a commercial system power supply.

2. Description of the Related Art

Since a distributed power supply such as a solar (photovoltaic) cell and a fuel cell for DC power generation is used by connecting it to a commercial system power supply, the distributed power supply comprises a power conditioner to convert the DC power to AC power so as to adapt the frequency and voltage to the power system. The power conditioner comprises: a DC/DC converter for adjusting a DC voltage generated by the distributed voltage supply to a predetermined voltage value; an inverter for converting a DC power output from the DC/DC converter to an AC power; an LC filter for removing harmonic components from the output of the inverter; and so on.

If a state is reached where a ground fault or a short circuit fault occurs in the distribution line to which the distributed power supply is grid-connected to operate, or where power supply from an electric power substation to the distribution line is stopped due to a planned power outage or the like, namely, if the distributed power supply is brought to islanding mode, it is necessary to disconnect the distributed power supply from the distribution line without fail in order to prevent an influence on the operation of a section switch and ensure safety in the work of the distribution line. There are passive and active methods in the islanding operation detection method, and either one or both of the passive and active methods is used for the power conditioner.

The passive method of islanding operation detection is a method to detect an abrupt change in, for example, the voltage phase or frequency due to unbalance between power generation output and load when the distributed power supply transitions to the islanding operation. The passive method includes, for example, a voltage phase jump detection method to detect an abrupt change in the voltage phase, and a third harmonic voltage distortion abrupt increase detection method to detect the third harmonic accompanied by saturation of a transformer.

On the other hand, the active method of islanding operation detection is a method to continuously provide a change in the voltage or frequency by using a resistor and the like added to a control system of the power conditioner or outside so as to detect a change in the voltage or frequency which becomes large when the distributed power supply transitions to the islanding operation. The active method includes, for example, a slip mode frequency shift method to detect an anomaly in the frequency by providing a positive feedback to the phase of an output current based on a small change in the frequency, and a reactive power variation method to provide an output with a cyclic (periodic) change in the reactive power and detect a change in the frequency which occurs when the distributed power supply transitions to islanding mode. The active method is standardized by the Japan Electrical Manufacturers' Association (JEM) as a frequency feedback method with step reactive power injection as described in the Standard of JEM (JEM 1498 issued on Aug. 27, 2012).

Japanese Laid-open Patent Publication 2015-23653 proposes a power conditioner which can detect islanding operation with a higher accuracy than a conventional one in the case of a short data collection time. This power conditioner comprises: a sensor for detecting a system voltage which is a voltage of the AC power converted from the DC power and output to the commercial power system; first cycle (period) acquisition means for detecting positive zero-crossings of the system voltage detected by the sensor so as to detect a first cycle of the system voltage based on an interval between the detected positive zero-crossings; second cycle acquisition means for detecting negative zero-crossings of the system voltage detected by the sensor so as to detect a second cycle of the system voltage based on an interval between the detected negative zero-crossings; and system evaluation means for acquiring the first cycle information and the second cycle information in the order of detection so as to evaluate the state of the commercial power system based on the first and second cycle information, and thereby detect an anomaly in the commercial power system. The system evaluation means comprises slope detection means for detecting the slope of change in the sequentially acquired cycles of the commercial power system so as to determine that the commercial power system is in an anomaly if a state where the slope detected by the slope detection means is greater than a predetermined value continues for a predetermined time.

Japanese Laid-open Patent Publication 2015-223037 proposes a power conversion device aimed to reduce detection time from the occurrence of islanding operation to its detection, which conventionally required 0.5 to 1.0 second, to at most 0.2 second. This power conversion device comprises: an inverter which converts DC power to AC power and is grid-connected to an AC power system to operate; reactive power injection means for injecting reactive power into the AC power system; frequency change detection means for detecting a frequency change due to the injected reactive power; and islanding operation determination means for detecting an islanding operation of the inverter based on the detected frequency change. The islanding operation determination means allows the reactive power injection means to continuously inject reactive power corresponding to a frequency change which occurs when the islanding operation occurs, and determines that the inverter or power conversion device is in islanding mode if a state where the detected frequency change exceeds a certain range of change continues for a predetermined time.

However, the power conditioner proposed by Japanese Laid-open Patent Publication 2015-23653 and the power conversion device proposed by Japanese Laid-open Patent Publication 2015-223037 have the following problems. First, the use of the system evaluation means described in Japanese Laid-open Patent Publication 2015-23653 is based on the use of only a slope of an approximate straight line to determine whether or not the power conditioner is in islanding mode. Thus, if the frequency of the commercial power system, namely commercial system frequency (utility frequency), gradually changes in one direction, the islanding operation of the power conditioner can be properly detected.

However, for example, if the commercial system frequency transiently changes in the opposite direction, there is a problem that a long time is required for the detection. Further, if the commercial system frequency changes abruptly, for example, due to an instantaneous voltage drop of the commercial system power supply, an erroneous detection (hereafter referred to as "unnecessary detection") of islanding operation may occur.

Second, the use of the islanding operation determination means described in Japanese Laid-open Patent Publication 2015-223037 is based on continuous injection of reactive power for each cycle (period) of the commercial system frequency to determine that the inverter or power conversion device is in islanding mode if a state where the commercial system frequency exceeds a certain range of change continues for a predetermined time. Thus, the islanding operation can only be detected based on at least an integer multiple of the commercial system frequency.

BRIEF SUMMARY OF THE INVENTION

In view of the problems described above, it is an object of the present invention to provide an islanding operation detection device and an islanding operation detection method for at least one distributed power supply in which, when the at least one distributed power supply is grid-connected to a commercial system power supply to operate and an islanding operation occurs in the at least one distributed power supply, the islanding operation can be detected at a high speed (in a short time) regardless of the polarity of the connection of the at least one distributed power supply to the commercial system power supply.

According to a first aspect of the present invention, this object is achieved by an islanding operation detection device for at least one distributed power supply comprising an inverter grid-connected to a commercial system power supply, the islanding operation detection device comprising: a commercial system frequency measurement circuitry configured to measure a commercial system frequency based on zero-crossing timing of a commercial system voltage; a reactive power injection amount calculation circuitry configured to calculate an amount of reactive power injection in response to a frequency deviation which is a difference between a value of the commercial system frequency measured by the commercial system frequency measurement circuitry and a reference value of the commercial system frequency; a feedback signal generation circuitry comprising a first PLL circuitry configured to receive an input of the commercial system voltage and generate a reference system voltage signal synchronized with a phase angle of the commercial system voltage, and a second PLL circuitry configured to receive an input of a reverse power flow current and generate a reference reverse power flow current signal synchronized with a phase angle of the reverse power flow current, so that the feedback signal generation circuitry generates a feedback signal based on a phase difference between the reference system voltage signal and the reference reverse power flow current signal; a reactive current control circuitry configured to feedback-control an output current command value to the inverter based on a reactive current command value corresponding to the amount of reactive power injection calculated by the reactive current injection amount calculation circuitry and also based on the feedback signal generated by the feedback signal generation circuitry so as to inject reactive power corresponding to the calculated amount of reactive power injection into the commercial system power supply from the inverter; an output current control circuitry configured to update the reactive current command value when the phase angle of the commercial system voltage is in the range of $90N°±\Delta\varphi$ where N is an odd integer and $\Delta\varphi \leq \varphi_{th}$ (threshold) so as to control an output current value of the inverter to follow the output current command value; and an islanding operation detection circuitry configured to detect whether or not the at least one distributed power supply is in islanding mode, based on the commercial system frequency when the reactive power corresponding to the calculated amount of reactive power injection is injected.

According to a second aspect of the present invention, the above object is achieved by an islanding operation detection method for a distributed power supply comprising an inverter grid-connected to a commercial system power supply, the islanding operation detection method comprising: a commercial system frequency measurement step for measuring a commercial system frequency based on zero-crossing timing of the commercial system voltage; a reactive power injection amount calculation step for calculating an amount of reactive power injection in response to a frequency deviation which is a difference between a value of the commercial system frequency measured by the commercial system frequency measurement step and a reference value of the commercial system frequency; a feedback signal generation step comprising a first PLL processing step for receiving an input of the commercial system voltage and generating a reference system voltage signal synchronized with a phase angle of the commercial system voltage, and a second PLL processing step for receiving an input of a reverse power flow current and generating a reference reverse power flow current signal synchronized with a phase angle of the reverse power flow current, so as to generate a feedback signal based on a phase difference between the reference system voltage signal and the reference reverse power flow current signal; a reactive current control step for feedback-controlling an output current command value to the inverter based on a reactive current command value corresponding to the amount of reactive power injection calculated by the reactive current injection amount calculation step and also based on the feedback signal generated by the feedback signal generation step so as to inject reactive power corresponding to the calculated amount of reactive power injection into the commercial system power supply from the inverter; an output current control step for updating the reactive current command value when the phase angle of the commercial system voltage is in the range of $90N°±\Delta\varphi$ where N is an odd integer and $\Delta\varphi \leq \varphi_{th}$ (threshold) so as to control an output current value of the inverter to follow the output current command value; and an islanding operation detection step for detecting whether or not the distributed power supply is in islanding mode, based on the commercial system frequency when the reactive power corresponding to the calculated amount of reactive power injection is injected.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that the drawings are shown for the purpose of illustrating the technical concepts of the present invention or embodiments thereof, wherein.

Figure 3A:
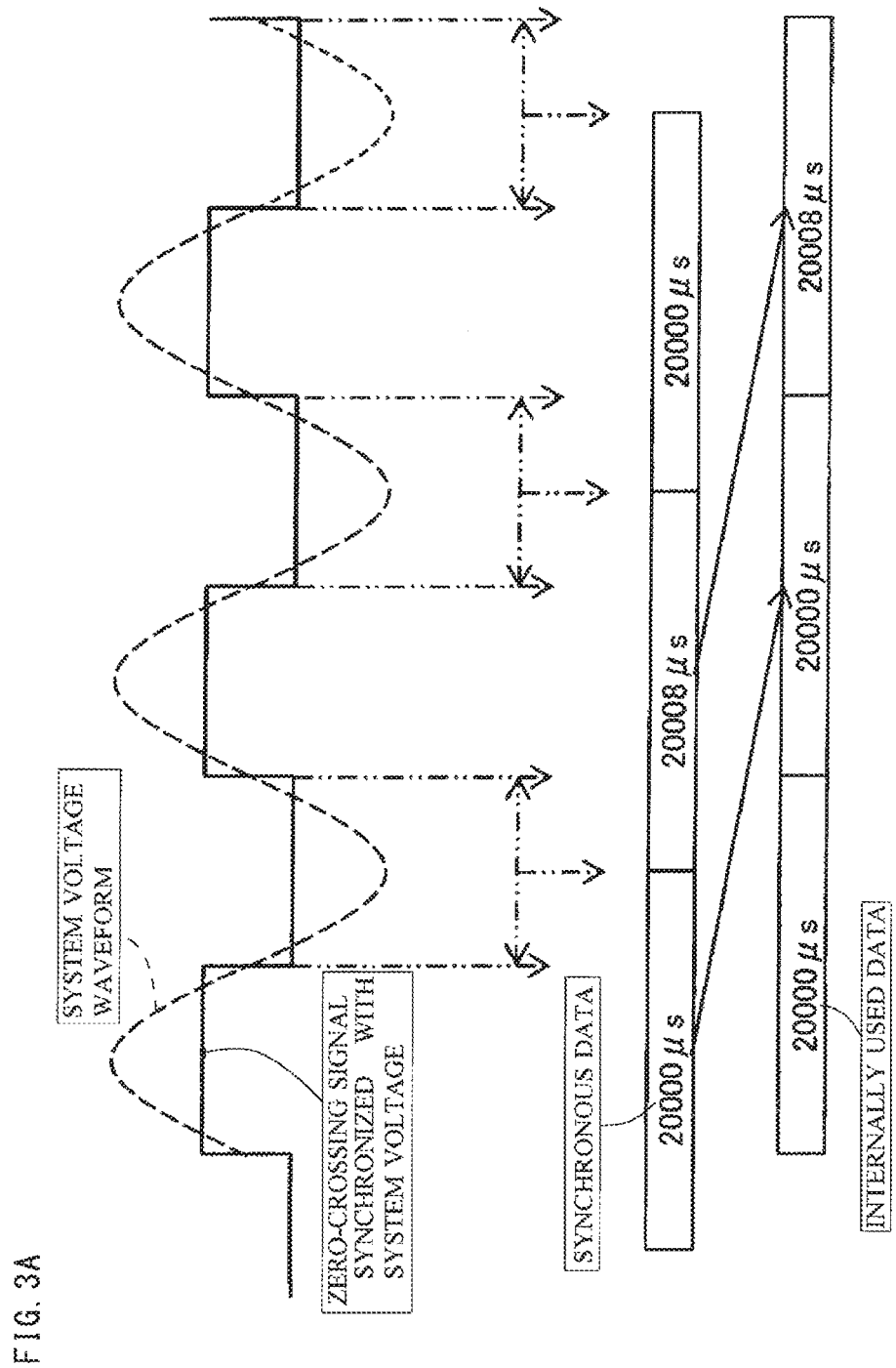
Figure 3B:
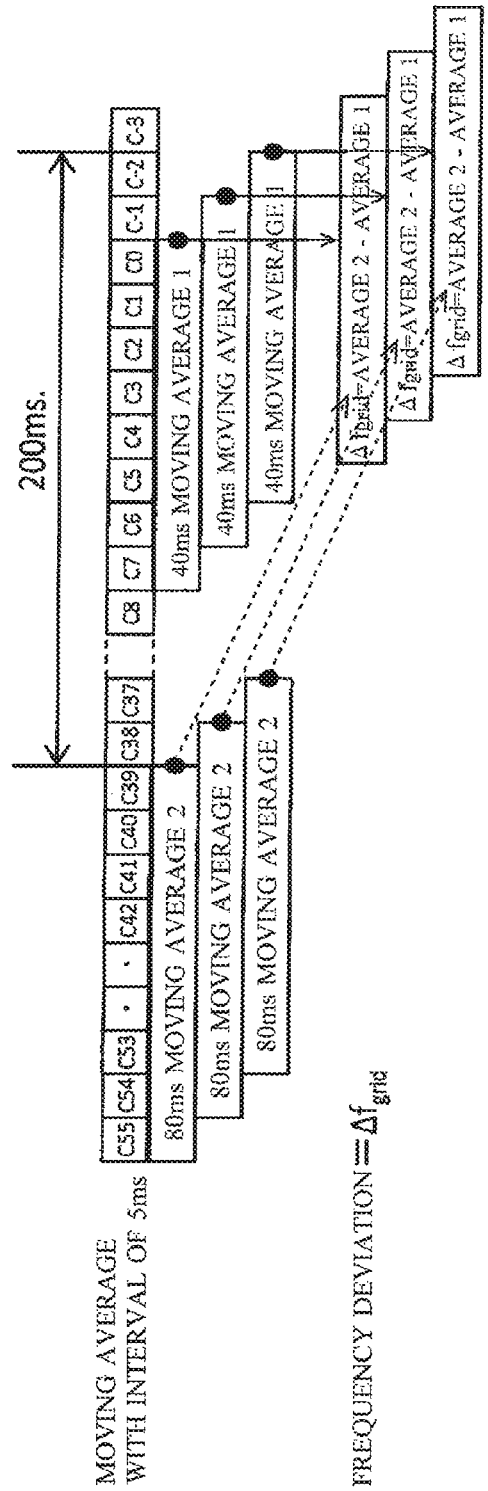
Figure 4A:
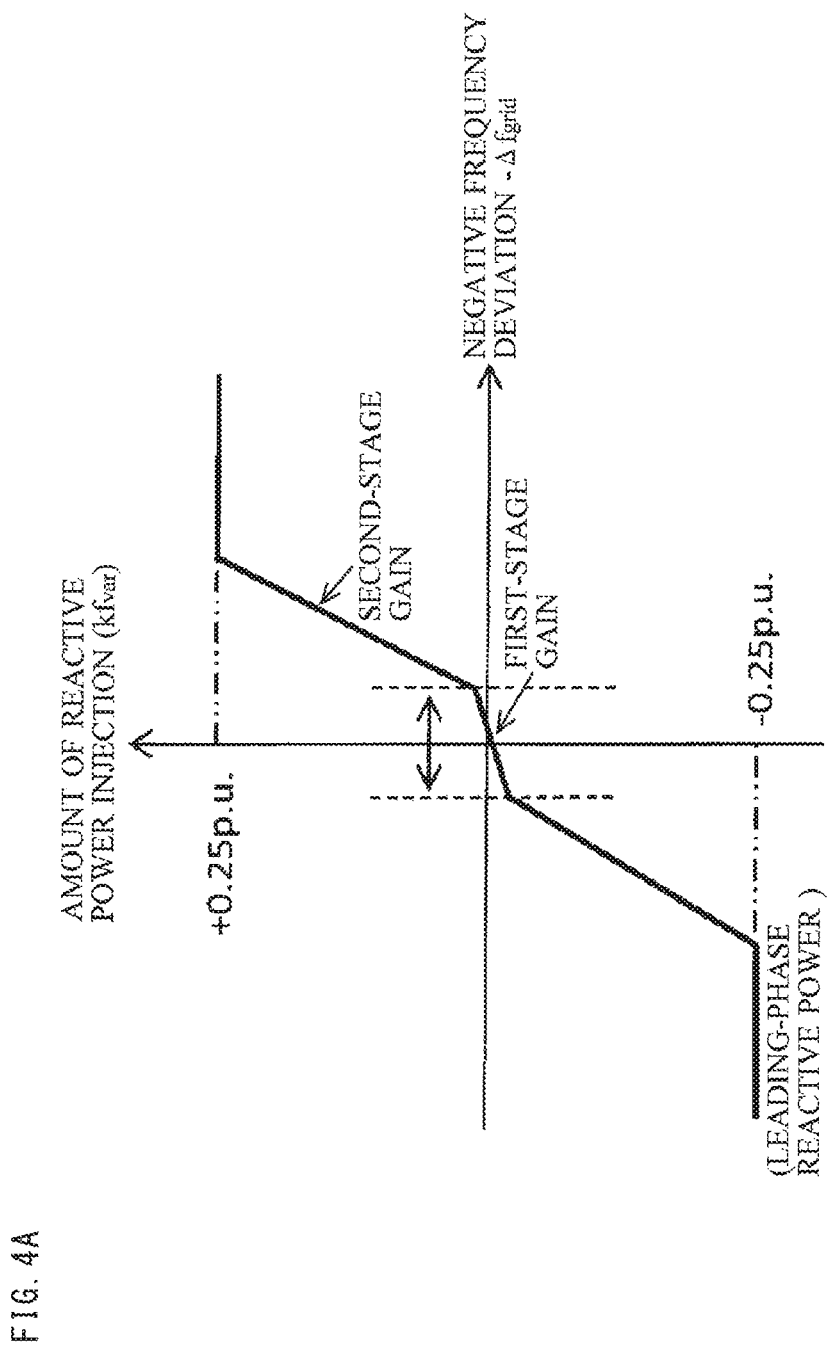
Figure 4B:
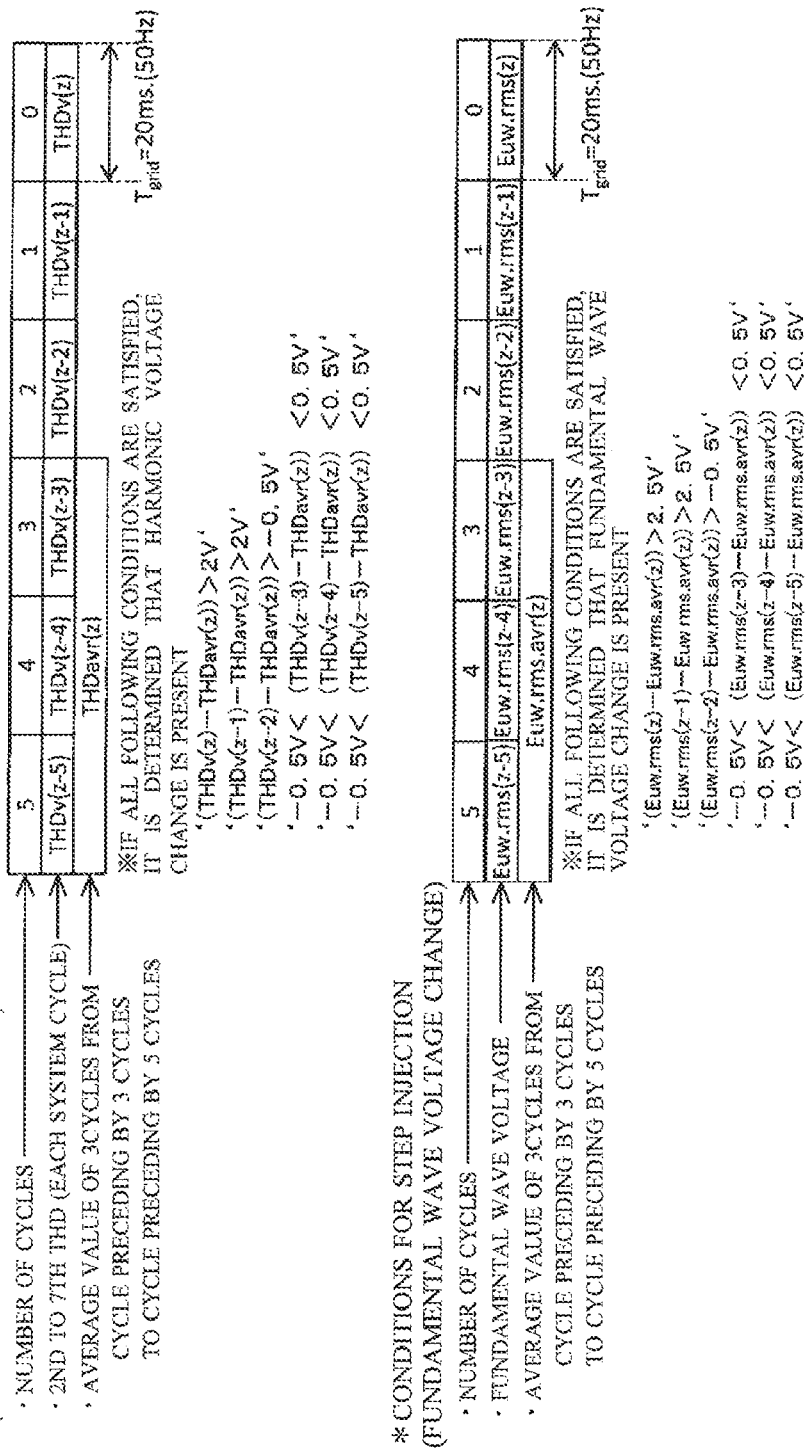
Figure 5A:
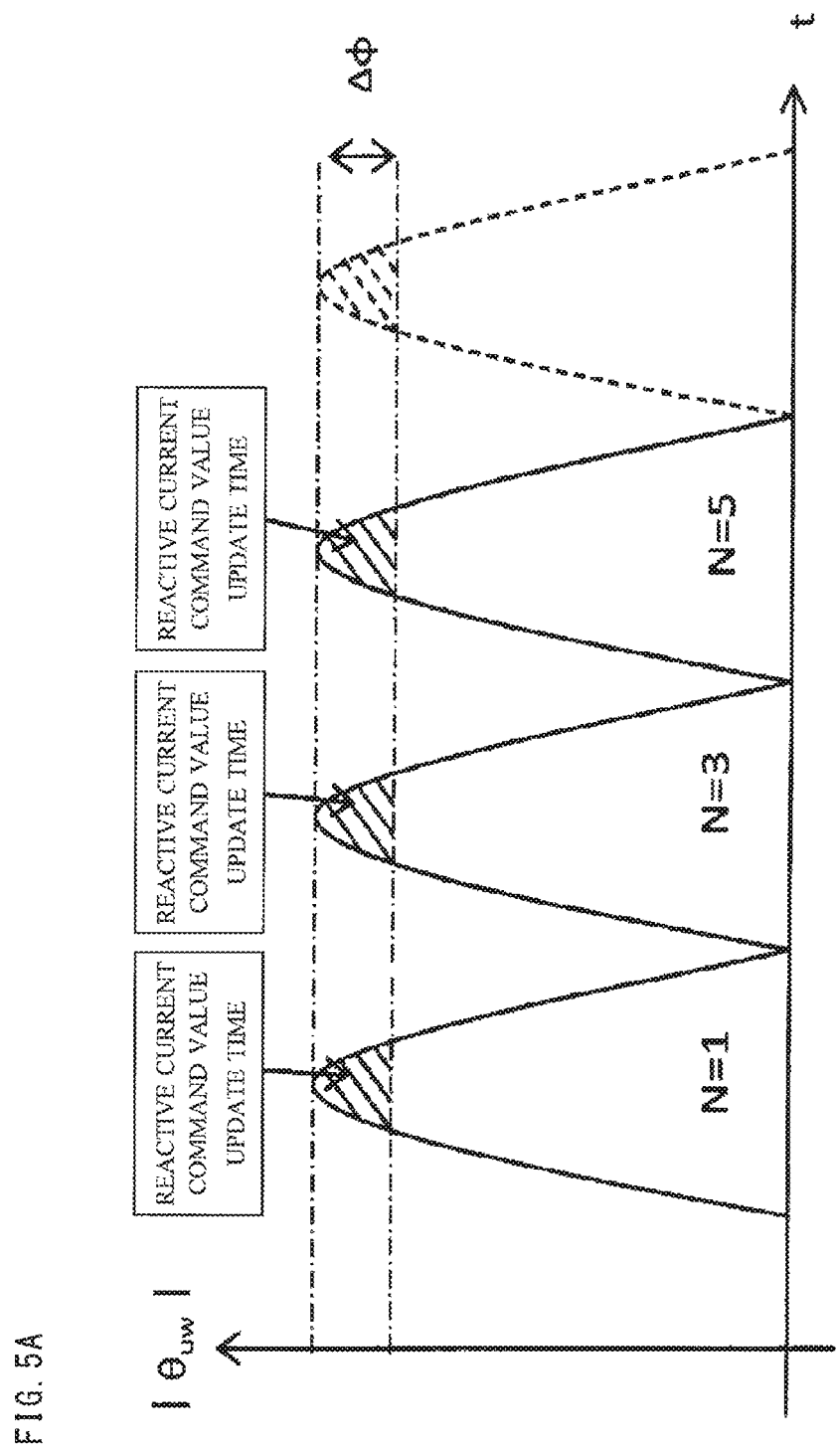
Figure 6A:
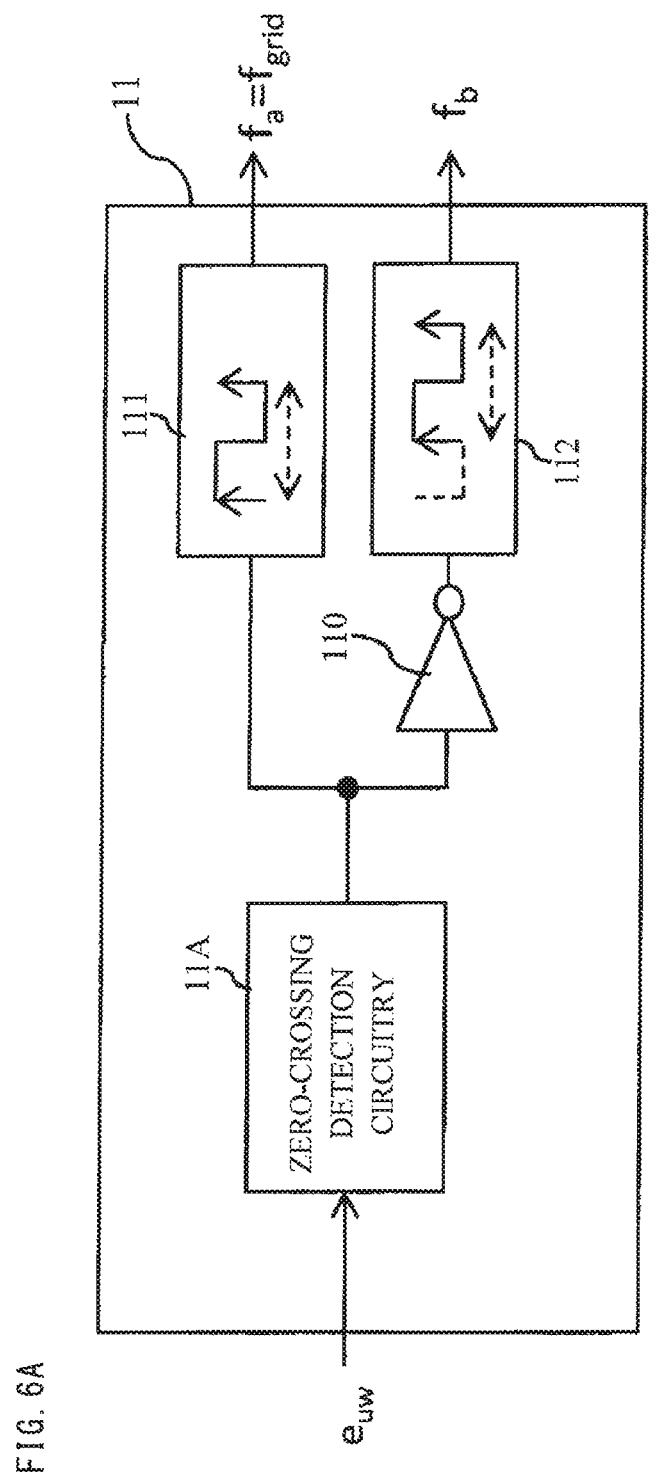
Figure 6C:
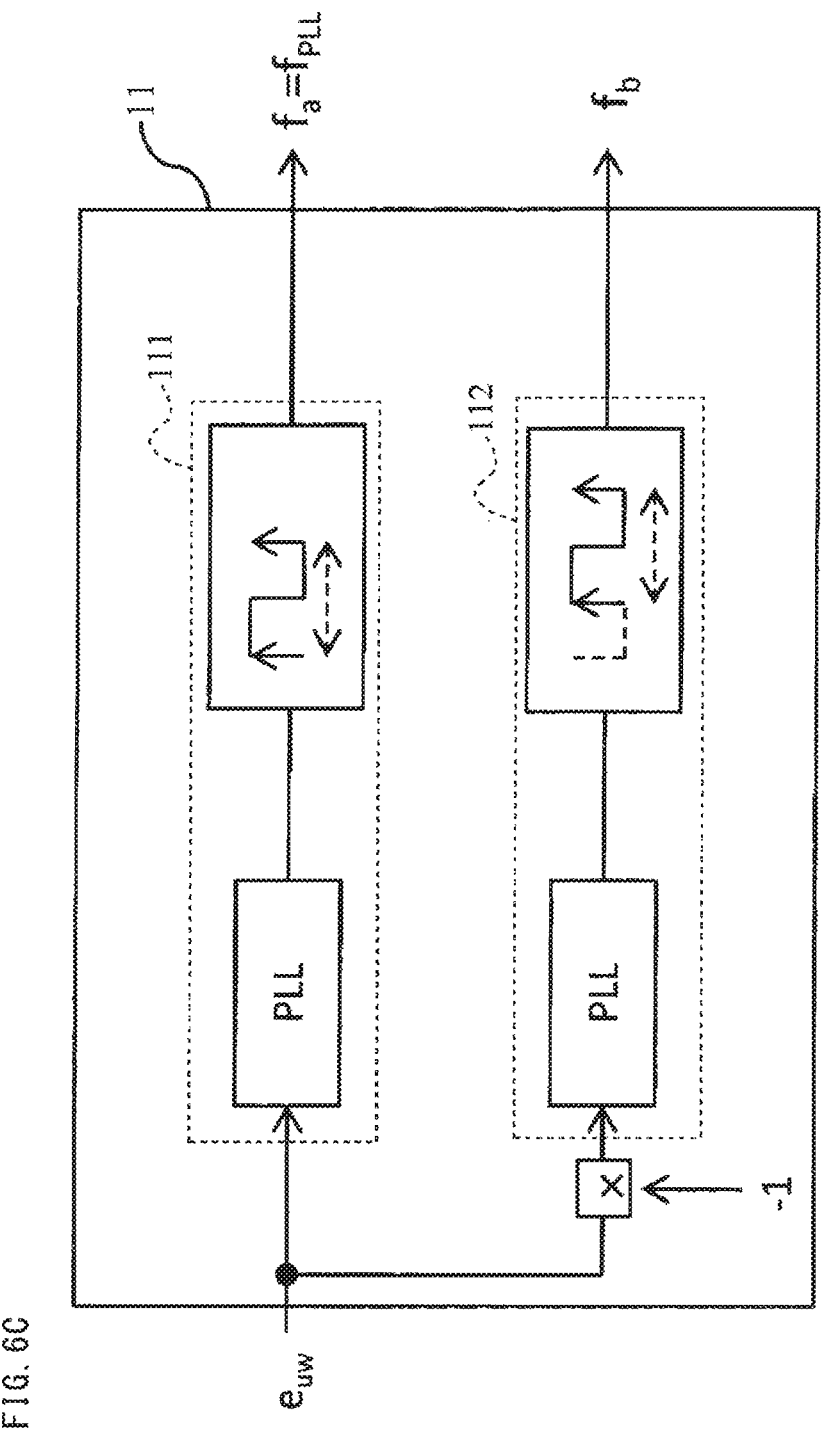
Figure 7:
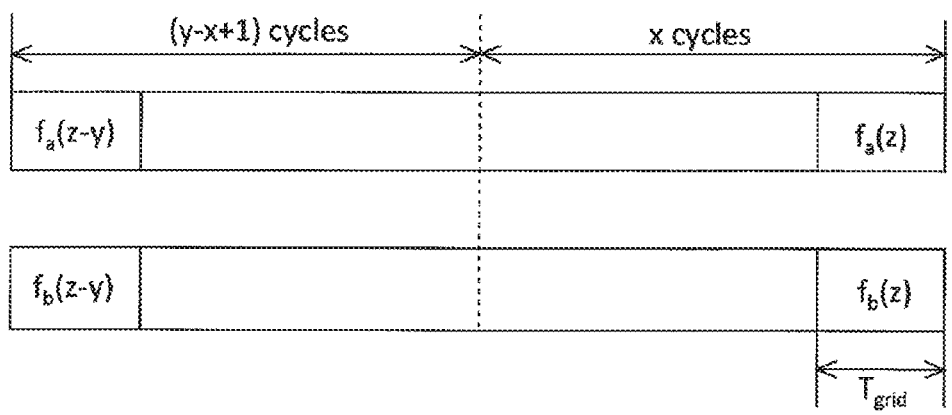
Figure 8:
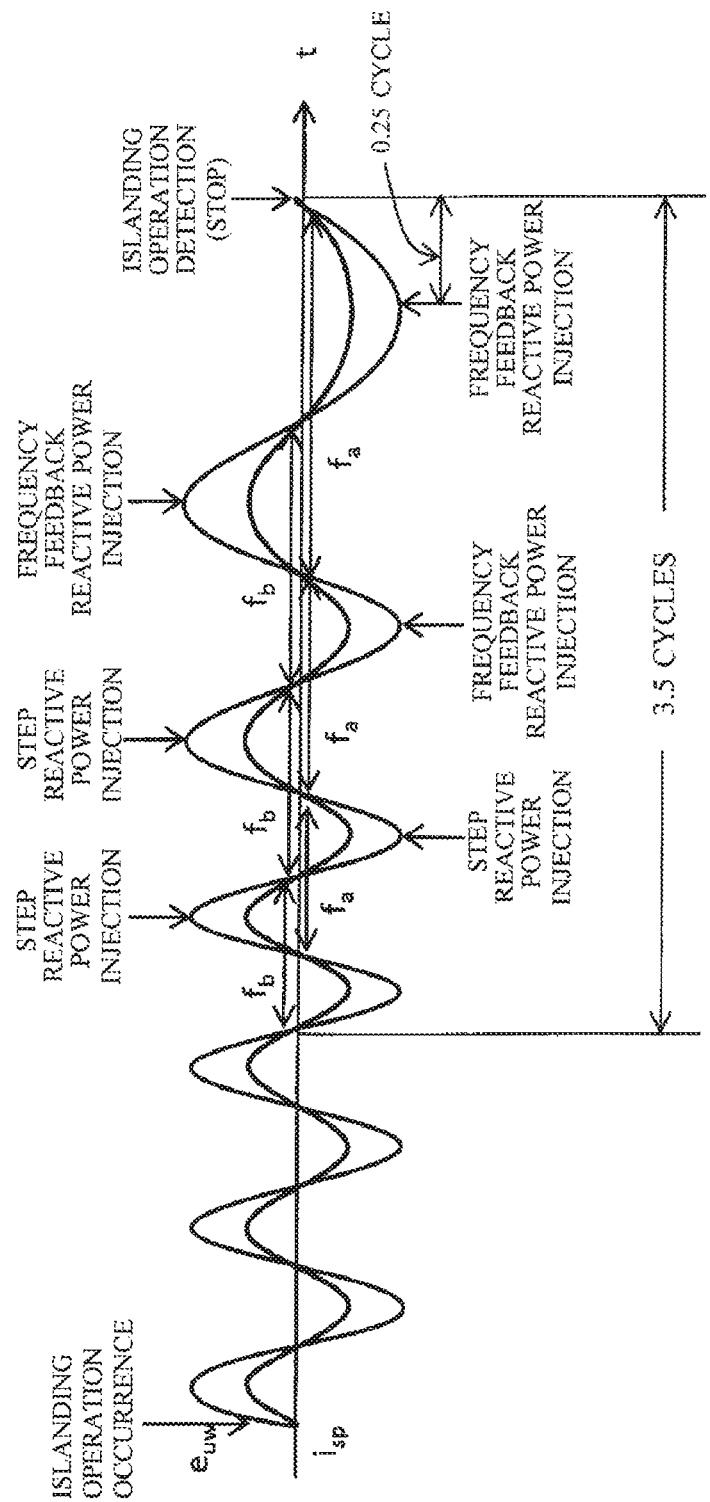
Figure 9A:
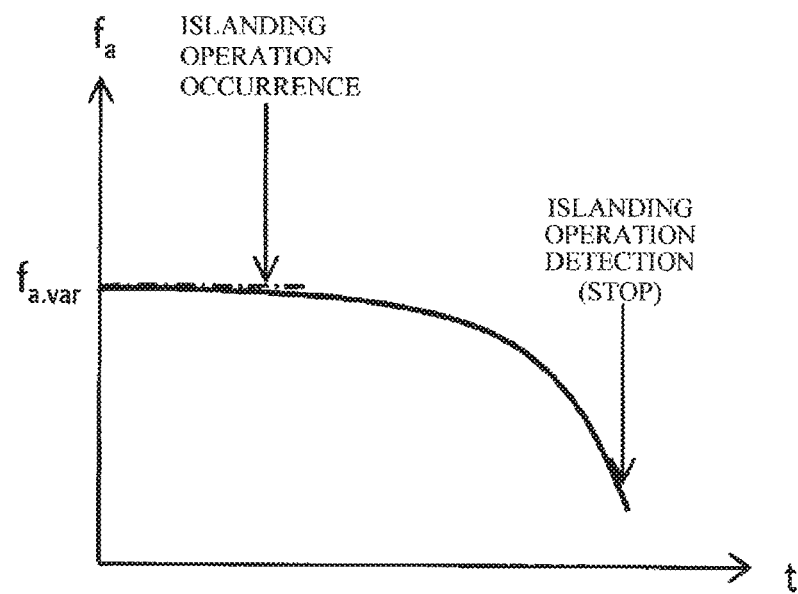
Figure 9B:
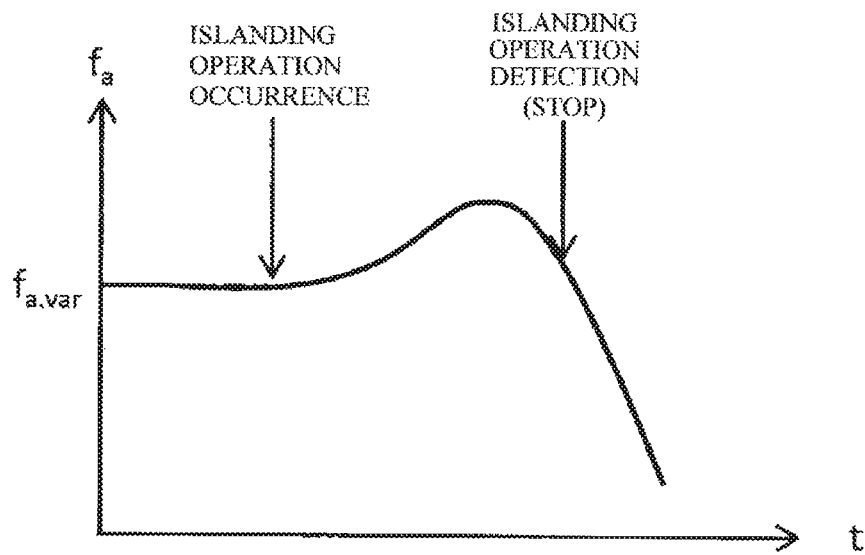
Figure 10:
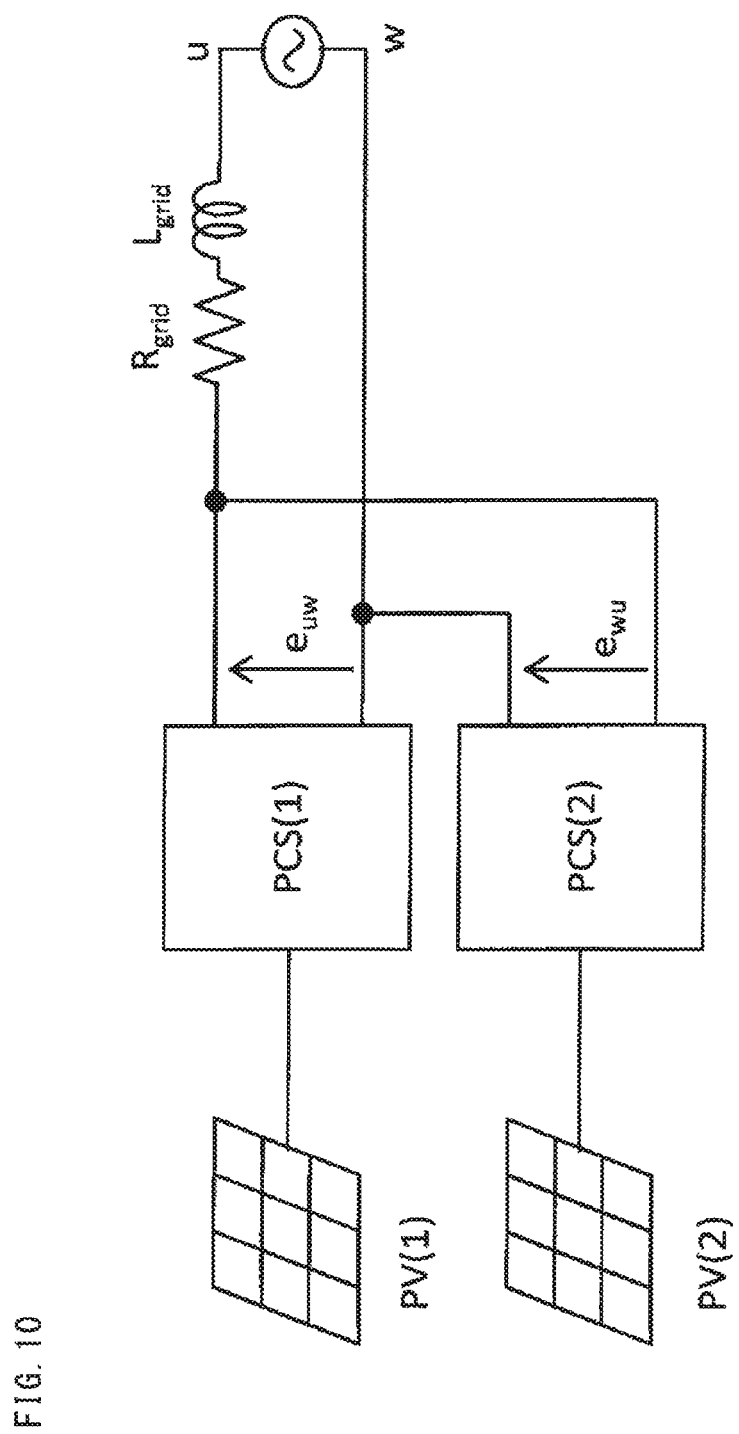

Each of FIGS. 3A, 3B and 3C is a schematic explanatory diagram of operation of a commercial system frequency measurement circuitry;

FIG. 4A is a graphical table for explaining a characteristic of frequency deviation versus amount of reactive power injection, which is used in a frequency responsive reactive power injection amount calculation circuitry, while FIG. 4B is a schematic explanatory diagram of operation of a step reactive power injection amount calculation circuitry;

FIG. 5A is a schematic diagram for explaining an update time of a reactive current command value, while FIG. 5B is a schematic diagram for explaining a waveform with an abrupt phase change due to an instantaneous voltage drop;

Each of FIGS. 6A, 6B and 6C is a schematic block diagram for explaining a first frequency measurement circuitry and a second frequency measurement circuitry;

FIG. 7 is a schematic diagram for explaining an arrangement of a first frequency measurement value (first measurement system frequency) $f_a$ and a second frequency measurement value (second measurement system frequency) $f_b$;

FIG. 8 is a schematic diagram for explaining waveforms from the occurrence of an islanding operation to the detection of the islanding operation;

Each of FIGS. 9A and 9B is a schematic diagram of a change in the commercial system frequency with time when the reactive current is injected; and FIG. 10 is a schematic block diagram for explaining an example of construction in which the polarity of the commercial system voltage is connected in reverse by mistake.

DETAILED DESCRIPTION OF THE INVENTION

Figure 1:
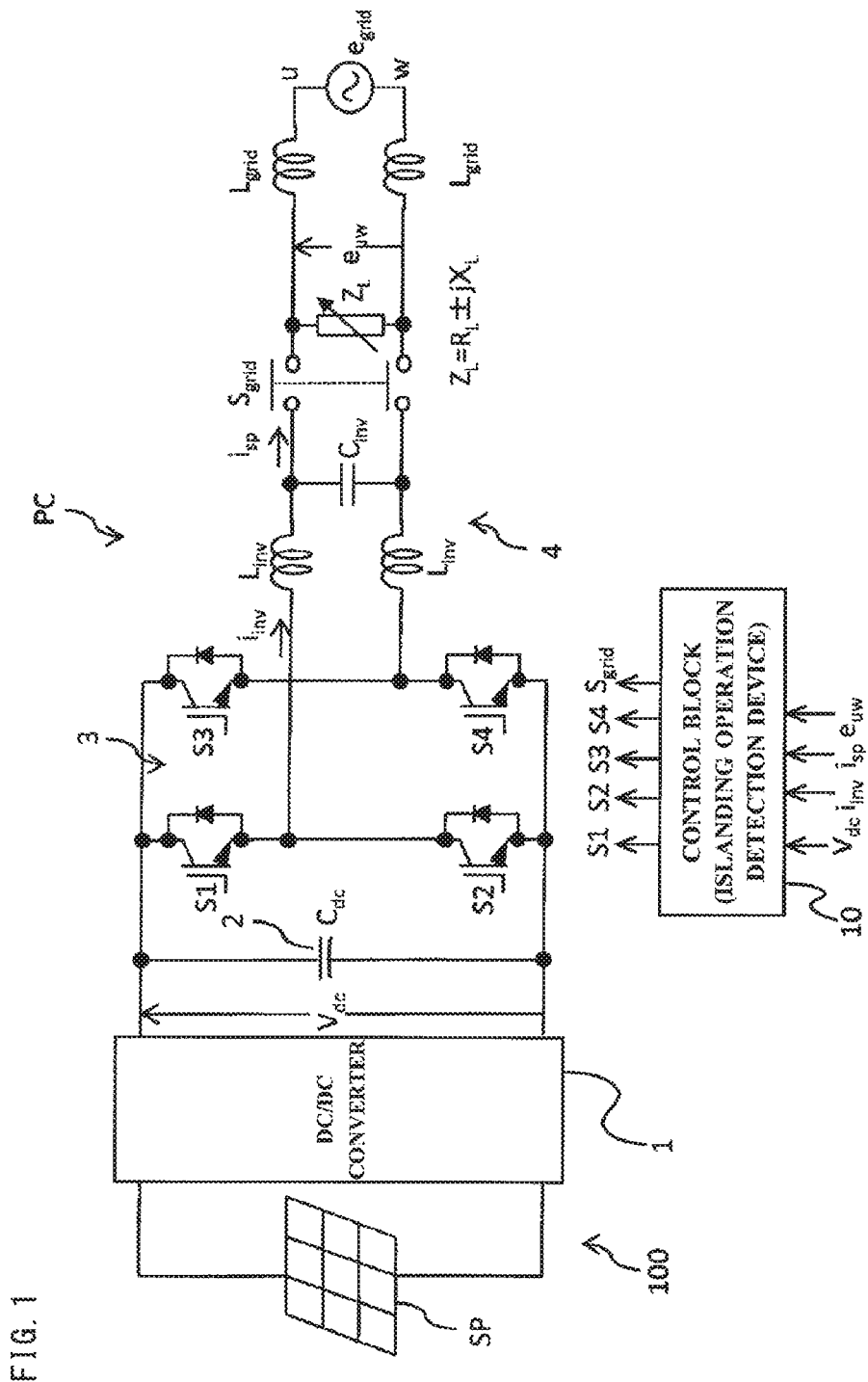
FIG. 1 is a schematic circuit diagram, partially in block form of a distributed power supply to which an islanding operation detection device according to an exemplary embodiment of the present invention is applied.

Hereinafter, an islanding operation detection device and an islanding operation detection method for a distributed power supply according to exemplary embodiments of the present invention will be described with reference to the drawings. FIG. 1 is a schematic circuit diagram, partially in block form of a solar (photovoltaic) cell power generator 100 as an example of a distributed power supply to which an islanding operation detection device 10 according to an exemplary embodiment of the present invention is applied. The solar cell power generator 100 comprises a solar cell panel SP and a power conditioner PC connected to the solar cell panel SP, and is connected to a commercial system power supply $e_{grid}$ through a grid connection relay $S_{grid}$. Note that the present invention is not limited to the use of the solar cell panel SP as the power generator connected to the power conditioner PC, and can also be applied to the case where another power generator such as a fuel cell is connected to the power conditioner PC.

The power conditioner PC comprises: a DC/DC converter 1 for boosting DC voltage generated by the solar cell panel SP to a predetermined DC link voltage $V_{dc}$; an inverter 3 for converting the DC link voltage $V_{dc}$ to AC voltage of predetermined frequency and voltage value to allow the power conditioner PC to be grid-connected to the commercial system power supply $e_{grid}$ to operate; and an LC filter 4 with an inductor $L_{inv}$ and a capacitor $C_{inv}$ for removing harmonic components. The inverter 3 comprises switches S1, S2, S3, S4 which are turned on/off under PWM (Pulse Width Modulation) control by a control block including the islanding operation detection device 10 so as to adapt the frequency and voltage to the commercial power system for the purpose of grid connection to the commercial power system. The output of the inverter 3 is processed by the LC filter 4 to remove harmonic components from the output, and is output as sine wave AC power. Note that in FIG. 1, the symbol $C_{dc}$ indicates an electrolytic capacitor for stabilizing the DC link voltage $V_{dc}$, the symbol $i_{inv}$ indicates an output current of the inverter 3, the symbol $L_{grid}$ indicates a power system impedance, the symbol $e_{uw}$ indicates a line-to-line system voltage between the U-phase and the W-phase of the commercial power system, the symbol $i_{sp}$ indicates a reverse power flow current, and the symbol $Z_L$ indicates an AC load.

Figure 2:
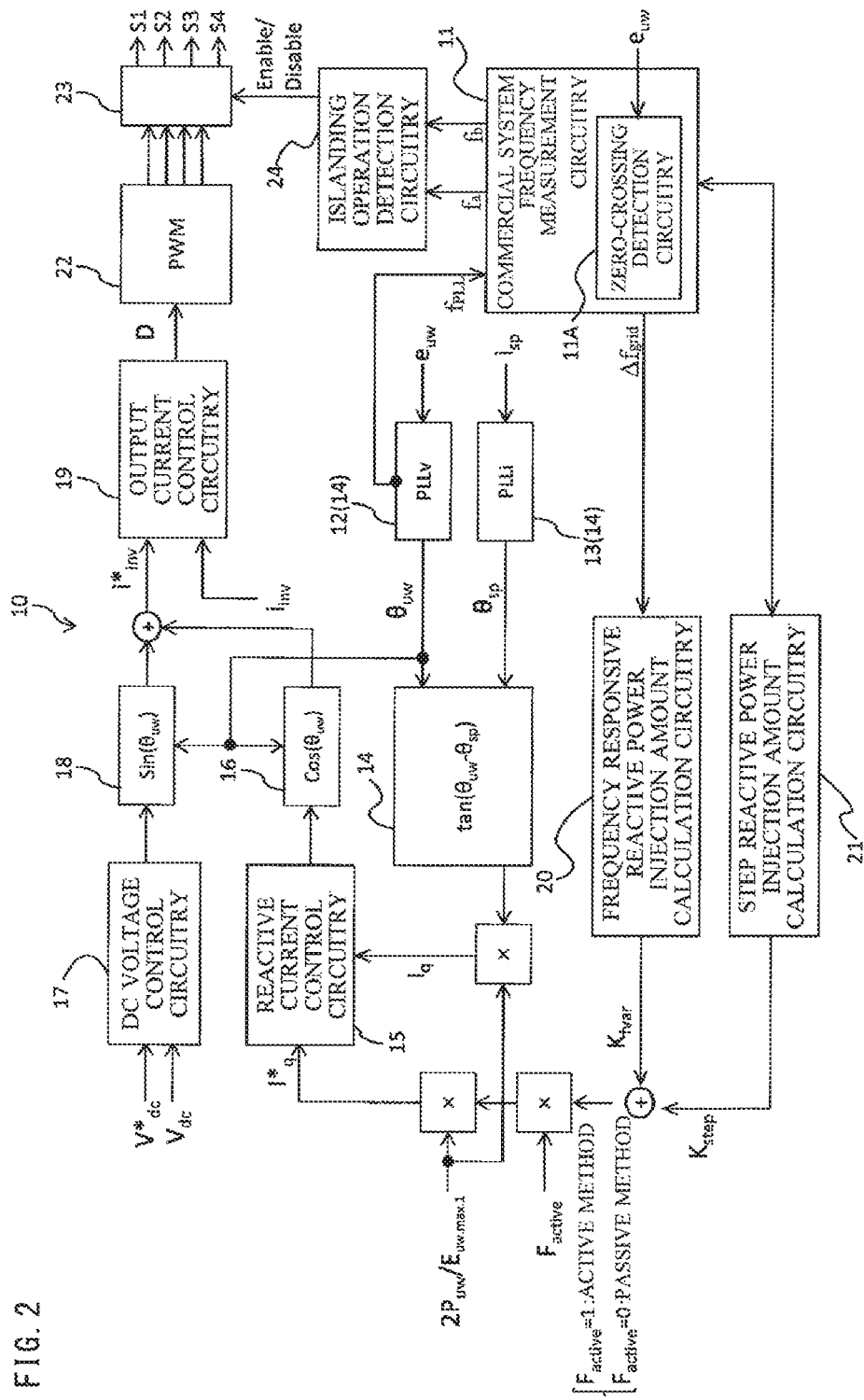
FIG. 2 is a schematic block diagram of a control block of the islanding operation detection device.

FIG. 2 shows a schematic function control block of the islanding operation detection device 10 which comprises a microcomputer, a memory, a peripheral circuitry and so on. In the present exemplary embodiment, the islanding operation detection device 10 is designed to comply with the frequency feedback method with step reactive power injection, and perform a desired islanding operation detection method based on, for example, a control program including an algorithm to avoid an unnecessary detection as intended by the present invention. The islanding operation detection device 10 is designed so that when $F_{active}$ (function of activemethod) in FIG. 2 is set to "1", an islanding operation detection based on the frequency feedback method with step reactive power injection is performed. On the other hand, when $F_{active}$ is set to "0", the islanding operation detection based on the frequency feedback method with step reactive power injection is masked, and instead an islanding operation detection based on the passive method of islanding operation detection is performed.

The islanding operation detection device 10 comprises a commercial system frequency measurement circuitry 11, reactive power injection amount calculation circuitry (frequency responsive reactive power injection amount calculation circuitry 20 and step reactive power injection amount calculation circuitry 21), a first PLL (Phase Locked Loop) circuitry 12, a second PLL circuitry 13, a feedback signal generation circuitry 14, a reactive current control circuitry 15, an active power generation circuitry 18, a reactive power generation circuitry 16, an output current control circuitry 19, an islanding operation detection circuitry 24, and so on. These circuitries are formed by basic functional blocks of the microcomputer. The commercial system frequency measurement circuitry 11 is a block configured to measure a commercial system frequency $f_{grid}$ based on zero-crossing timing of a commercial system voltage $e_{uw}$, and comprises a zero-crossing detection circuitry 11A including a voltage dividing circuitry configured to divide an AC voltage and a binarization circuitry configured to binarize a divided voltage signal.

Each of FIGS. 3A, 3B and 3C is a schematic explanatory diagram of operation of the commercial system frequency measurement circuitry 11. As shown in FIG. 3A, in the commercial system frequency measurement circuitry 11, a commercial system voltage waveform (shown by the dashed curve in the drawing) obtained by dividing the commercial system voltage $e_{uw}$ by a resistor is binarized by the binarization circuitry using zero voltage as a threshold to obtain a rectangular wave (shown by the solid line in the drawing) having a duty ratio of 50% and corresponding to the commercial system frequency. As indicated by the two-dot chain lines in FIG. 3A, the time difference between the midpoint between the trailing and leading edges of each pulse of the rectangular wave and the midpoint between the trailing and leading edges of the next pulse is measured at a sampling frequency of 2.5 MHz (with an accuracy of 0.4 μs) to measure the commercial system frequency $f_{grid}$ corresponding to the commercial system voltage $e_{uw}$. Note that such a value of the sampling frequency is only an example, and the sampling frequency is not limited thereto.

The reactive power injection amount calculation circuitry comprises a frequency responsive reactive power injection amount calculation circuitry 20 and a step reactive power injection amount calculation circuitry 21. The frequency responsive reactive power injection amount calculation circuitry 20 is a block configured to calculate an amount of reactive power injection $k_{fvar}$ in response to a frequency deviation $\Delta f_{grid}$ obtained based on the commercial system frequency $f_{grid}$ measured by the commercial system frequency measurement circuitry 11. The frequency responsive reactive power injection amount calculation circuitry 20 calculates the amount of reactive power injection $k_{fvar}$ from a table of a characteristic of frequency deviation versus amount of reactive power injection which defines the amount of reactive power injection so that, in response to a frequency deviation $\Delta f_{grid}$ at a certain point of time, each subsequent frequency deviation thereafter gradually increases. Here, the frequency deviation $\Delta f_{grid}$ is a difference between a value of the commercial system frequency $f_{grid}$ measured by the commercial system frequency measurement circuitry 11 and a reference value of the commercial system frequency (which is 50 Hz in the present exemplary embodiment).

As shown in FIG. 3C, in the commercial system frequency measurement circuitry 11, the commercial system frequency $f_{grid}$ is updated each cycle (period), and a moving average of the commercial system frequency $f_{grid}$ for the immediately preceding duration of 40 ms is calculated every 5 ms and is stored in a storage unit. As shown in FIG. 3B, the frequency deviation $\Delta f_{grid}$ is calculated by subtracting the moving average for the immediately preceding duration of 40 ms from the moving average for the duration of 80 ms which precedes, by 200 ms, the calculation of the moving average for the immediately preceding duration.

FIG. 4A shows a characteristic of frequency deviation versus amount of reactive power injection. Based on the characteristic of the frequency deviation versus the amount of reactive power injection, the frequency responsive reactive power injection amount calculation circuitry 20 calculates the amount of reactive power injection $k_{fvar}$ to inject the amount of reactive power injection $k_{fvar}$ as calculated within a half cycle (period) of the commercial system frequency $f_{grid}$ after the calculation of the frequency deviation $\Delta f_{grid}$, into the commercial system power supply $e_{grid}$ from the solar cell power generator 100 (or power conditioner PC). The characteristic of the frequency deviation versus the amount of reactive power injection defines the amount of reactive power injection $k_{fvar}$ so as to have different slopes between a low sensitivity range thereof where the frequency deviation $\Delta f_{grid}$ is within ±0.01 Hz, and a high sensitivity range thereof where the frequency deviation $\Delta f_{grid}$ is outside ±0.01 Hz. The characteristic of the frequency deviation versus the amount of reactive power injection is designed to help to increase the frequency deviation by injecting a lagging-phase reactive power if the frequency deviation increases in the positive direction, and by injecting a leading-phase reactive power if the frequency deviation decreases in the negative direction.

Here, the positive or negative sign of the frequency deviation $\Delta f_{grid}$ calculated in FIG. 3B is opposite to that of the reactive power injection $k_{fvar}$ shown in FIG. 4A. The reason for this definition is that the reactive current $I_q$ shown in FIG. 2 is calculated from $\tan(\theta_{uw}-\theta_{sp})$. In other words, each of the reference values of the leading phase and the lagging phase is a phase angle $\theta_{uw}$ of the commercial system voltage. Further, the amount of the reactive power injection $k_{fvar}$ is defined to have a maximum value, and is set to have a first stage gain in the low sensitivity range of the characteristic of the frequency deviation versus the amount of reactive power injection and a second stage gain in the high sensitivity range of the characteristic in which the second stage gain has a slope greater than that of the first stage gain. The maximum value of the reactive power injection $k_{fvar}$ is set to ±0.25 p.u. (per unit). Note that the characteristic of the frequency deviation versus the amount of reactive power injection shown is only an example, and is not limited thereto.

The step reactive power injection amount calculation circuitry 21 is a block configured to calculate a certain amount of reactive power injection $k_{step}$ in a certain direction of the current phase at a certain point of time in which the frequency deviation $\Delta f_{grid}$ does not change, and the fundamental wave voltage $E_{uw}$ and/or harmonic voltage $THD_v$ change/changes. Note that in the present specification, the state "in which the frequency deviation does not change" is used to mean a concept that includes a state in which the change is small, namely a state in which the amount of reactive power injection $k_{fvar}$ is in the above-described low sensitivity range. FIG. 4B shows operation of the step reactive power injection amount calculation circuitry 21. As shown in FIG. 4B, if the step reactive power injection amount calculation circuitry 21 determines that the harmonic voltage change satisfies all the following conditional expressions when the frequency deviation $\Delta f_{grid}$ is in the low sensitivity range, the step reactive power injection amount calculation circuitry 21 injects, within a half cycle of the harmonic voltage after the determination, reactive power with an upper limit of 0.1 p.u. ($K_{step}$=0.1) for a duration of at most 3 cycles in a direction to delay the current phase of the reactive power as seen from the power conditioner PC, namely in a direction to decrease the frequency of the reactive power:

$$THD_v(z)-THD_{avr}(z)>2V$$

$$THD_v(z-1)-THD_{avr}(z)>2V$$

$$THD_v(z-2)-THD_{avr}(z)>-0.5V$$

$$|THD_v(z-3)-THD_{avr}(z)|<0.5V$$

$$|THD_v(z-4)-THD_{avr}(z)|<0.5V$$

$$|THD_v(z-5)-THD_{avr}(z)|<0.5V$$

As shown in Equation set 1 below, an effective value (root mean square value) of a total harmonic voltage from the 2nd to 7th harmonics is used as an effective value of the harmonic voltage $THD_v$ as a preferred mode of the present exemplary embodiment, but can also include higher order harmonics. Note that the effective value of the harmonic voltage will be referred to simply as harmonic voltage. Further note that in Equation set 1, $T_{ADC}$ is sampling time of the A/D converter, and n is harmonic order.

[Equation set 1]

$$A_n(z) = \frac{\sum_{k=0}^{K-1} e_{uw,n}(k) \cdot \cos(2\pi \cdot n \cdot f_{grid}(z) \cdot k \cdot T_{ADC})}{K/2}$$

$$B_n(z) = \frac{\sum_{k=0}^{K-1} e_{uw,n}(k) \cdot \sin(2\pi \cdot n \cdot f_{grid}(z) \cdot k \cdot T_{ADC})}{K/2}$$

$$E_{uw.rms,n}(z) = \sqrt{0.5 \cdot [A_n^2(z) + B_n^2(z)]}$$

$$K = \frac{1}{f_{grid}(z) \cdot T_{ADC}}, \quad n = 1 \sim 7$$

$$THD_V(z) = \sqrt{\sum_{n=2}^{7} E_{uw.rms,n}^2(z)}$$

$$THD_{avr}(z) = \frac{1}{3} \sum_{n=3}^{5} THD_V(z-n)$$

As also shown in FIG. 4B, if the step reactive power injection amount calculation circuitry 21 determines that the fundamental wave voltage change satisfies all the following conditional expressions when the frequency deviation $\Delta f_{grid}$ is in the low sensitivity range, the step reactive power injection amount calculation circuitry 21 injects, within a half cycle of the harmonic voltage after the determination, reactive power with an upper limit of 0.1 p.u. ($K_{step}$=0.1) for a duration of at most 3 cycles in a direction to delay the current phase of the reactive power as seen from the power conditioner PC, namely in a direction to decrease the frequency of the reactive power:

$E_{uw,rms}(z) - E_{uw,rms,avr}(z) > 2.5V$ $E_{uw,rms}(z-1) - E_{uw,rms,avr}(z) > 2.5V$ $E_{uw,rms}(z-2) - E_{uw,rms,avr}(z) > -0.5V$ $|E_{uw,rms}(z-3) - E_{uw,rms,avr}(z)| < 0.5V$ $|E_{uw,rms}(z-4) - E_{uw,rms,avr}(z)| < 0.5V$ $|E_{uw,rms}(z-5) - E_{uw,rms,avr}(z)| < 0.5V$ The first PLL circuitry 12 is a block configured to receive an input of a commercial system voltage $e_{uw}$ and generate a reference system voltage signal synchronized with a phase angle $\theta_{uw}$ of the commercial system voltage $e_{uw}$, while the second PLL circuitry 13 is a block configured to receive an input of a reverse power flow current $i_{sp}$ and generate a reference reverse power flow current signal synchronized with a phase angle $\theta_{sp}$ of the reverse power flow current $i_{sp}$. In the present exemplary embodiment, a gain G1 of the first PLL circuitry 12 is set to be greater than a gain G2 of the second PLL circuitry 13. More specifically, they are set to be G2=0.5G1, and are preferred to be at least in a relationship G2≤0.5G1. The feedback signal generation circuitry 14 comprises the first PLL circuitry 12 and the second PLL circuitry 13, and is a block configured to calculate a phase difference ($\theta_{uw} - \theta_{sp}$) between the reference system voltage signal and the reference reverse power flow current signal and generate a feedback signal based on the calculated value of the phase difference.

The reactive current control circuitry 15 is a block configured to feedback-control an output current command value $i^*_{inv}$ to the inverter 3 based on a reactive current command value $I^*_q$ corresponding to the amount of reactive power injection $K_{fvar}$, $K_{step}$, which is calculated by the reactive power injection amount calculation circuitries 20, 21 as a target amount, and also based on a feedback signal $I_q$ generated by the feedback signal generation circuitry 14, so as to inject reactive power corresponding to the calculated (target) amount of reactive power injection $K_{fvar}$, $K_{step}$ into the commercial system power supply from the inverter 3. More specifically, the reactive current control circuitry 15 performs PID (Proportional Integral Derivative) calculation to allow the feedback signal $I_q$ to converge to the reactive current command value $I^*_q$, and outputs the calculated value as a command value to the reactive power generation circuitry 16.

As shown in Equation set 2 below, the reactive current command value $I^*_q$ is a value obtained by multiplying the amount of reactive power injection ($K_{fvar}+K_{step}$) by a value which is obtained by dividing a double value of fundamental wave active power ($2P_{uw}$) by an amplitude value $E_{uw,max,1}$ of the fundamental wave voltage.

[Equation 2 set]

$$P_{uw} = \frac{1}{T_{grid}} \int_0^{T_{grid}} e_{uw}(t) \cdot i_{sp}(t) dt$$

$$I^*_q = (2P_{uw}/E_{uw,max,1}) \cdot (K_{step} + K_{fvar})$$

The active power generation circuitry 18 is a block configured to generate an active power component by multiplying a bias DC voltage output from a DC voltage control circuitry 17 (refer to FIG. 2) by a sine wave with a phase angle $\theta_{uw}$ of the commercial system voltage (commercial system power supply). The bias DC voltage is input from the DC voltage control circuitry 17 which regulates a DC link voltage $V_{dc}$ output from the DC/DC converter 1 to a DC voltage command value $V^*_{dc}$ for output, while the sine wave with the phase angle $\theta_{uw}$ of the commercial system voltage is input from the first PLL circuitry 12. The reactive power generation circuitry 16 is block configured to generate a reactive power component by multiplying the reactive current command value $I^*_q$, which is feedback-controlled by the reactive current control circuitry 15, by a cosine wave with a phase angle $\theta_{uw}$ of the commercial system voltage (commercial system power supply) which is input from the first PLL circuitry 12.

The output of the active power generation circuitry 18 and the output of the reactive power generation circuitry 16 are added by an adder to generate an output current command value $i^*_{inv}$ to the inverter 3, and the output current command value $i^*_{inv}$ is input to the output current control circuitry 19. The output current control circuitry 19, which receives an input of an output current value $i_{inv}$ of the inverter 3 as a feedback value, performs a feedback control using, for example, PID calculation so as to allow the output current value of the inverter 3 to converge to the current command value $i^*_{inv}$, thereby generating a control value to the inverter 3, which is a duty ration D here.

FIG. 5A is a schematic diagram for explaining an update time of a reactive current command value $I^*_q$. As shown in FIG. 5A, when the phase angle ($\theta_{uw}$) of the commercial system voltage ($e_{uw}$) is in the range of 90N°±Δφ where N is an odd integer and Δφ≤φ$_{th}$ (threshold), the output current control circuitry 19 updates the reactive current command value $I^*_q$, and gradually increases a reactive component of the output current command value $i^*_{inv}$ of the inverter 3 from near zero so as to control the output current value of the inverter 3 to follow the output current command value i*$_{inv}$. When the absolute value of the commercial system voltage (e$_{uw}$) is near its peak, the value of the reactive power to be a cosine wave is substantially zero, and therefore the reactive power can be stably injected without causing waveform distortion. The value of Δφ is only required to be equal to or lower than φ$_{th}$ (threshold). In the present exemplary embodiment, the threshold φ$_{th}$ is set to φ$_{th}$=10°, while Δφ is also set to Δφ=10°. The threshold φ$_{th}$ is only required to be set to a value which can avoid the occurrence of waveform distortion, and is preferred to be about φ$_{th}$=10±3°.

As a result, the islanding operation detection device 10 according to the present exemplary embodiment can accurately and quickly inject reactive power corresponding to a target amount of reactive power injection into the commercial system power supply, ensuring a good response to the reactive power injection, and can quickly detect whether or not the power conditioner PC or solar cell power generator 100 is in islanding mode without performing an unnecessary detection, eliminating the need for the use of a complex algorithm to avoid an unnecessary detection. The duty ratio D generated by the output current control circuitry 19 is input to a PWM (Pulse Width Modulation) control circuitry 22 (refer to FIG. 2). The PWM control circuitry 22 generates command signals to the switches S1, S2, S3, S4 of the inverter 3, respectively, and the command signals are output to the switches S1, S2, S3, S4 through a buffer circuitry 23.

The islanding operation detection circuitry 24 of FIG. 2 is a block configured to detect whether or not the solar cell power generator 100 (distributed power supply) is in islanding mode, based on a commercial system frequency of the commercial system power supply when the reactive power corresponding to the calculated amount (target amount) of reactive power injection is injected. The islanding operation detection circuitry 24 receives an input of a commercial system frequency f$_{grid}$ (first and second measurement system frequencies f$_a$, f$_b$) measured by the commercial system frequency measurement circuitry 11. Generally, if the commercial system voltage e$_{uw}$ is normal, an abrupt change in the commercial system frequency f$_{grid}$ can be used to correctly detect that the solar cell power generator 100 is in islanding mode. However, if the commercial system voltage e$_{uw}$ is not normal, an abrupt change in the commercial system frequency f$_{grid}$ may cause erroneous or unnecessary detection. For example, if a fault occurs in power equipment due to lightening or the like to cause an instantaneous voltage drop in the power transmission/distribution grid, an abrupt change in the phase of the commercial system voltage e$_{uw}$ due to the instantaneous voltage drop occurs.

FIG. 5B is a schematic diagram for explaining a waveform with an abrupt phase change due to an instantaneous voltage drop, showing an example of a waveform upon the instantaneous voltage drop. As shown in FIG. 5B, the instantaneous voltage drop occurs when the phase angle of the commercial system voltage e$_{uw}$ is 90°, while a decrease in the commercial system frequency f$_{grid}$(z−4) occurs at the moment when the phase angle deviates by +41° at maximum. This significant change in the frequency may cause an unnecessary detection of islanding operation if the islanding operation is determined based on only a slope of an appropriate straight line (slope of change in the cycle of the commercial system voltage). Here, it is important to note that when the phase abruptly changes due to an instantaneous voltage dropt or the like, the commercial system frequency f$_{grid}$ changes instantaneously, but the commercial system frequency f$_{grid}$ is stable (unchanged) before and after the instantaneous change. In contrast, in islanding mode, an intentional injection of reactive power is likely to cause an increase in the change in the commercial system frequency.

Each of FIGS. 6A, 6B and 6C is a schematic block diagram for explaining a first frequency measurement circuitry 111 and a second frequency measurement circuitry 112, showing three circuitry configurations to achieve the commercial system frequency measurement circuitry 11. In FIG. 6A, the commercial system frequency measurement circuitry 11 comprises a zero-crossing detection circuitry 11A shown in FIG. 2 and an inversion circuitry 110 configured to invert a rectangular wave output from the zero-crossing detection circuitry 11A. The commercial system frequency measurement circuitry 11 further comprises: a first frequency measurement circuitry 111 configured to measure a first measurement system frequency (first frequency measurement value) f$_a$ of the commercial system voltage e$_{uw}$ (line-to-line voltage) from the U-phase to the W-phase based on the period between adjacent leading edges of the rectangular wave output from the zero-crossing detection circuitry 11A; and a second frequency measurement circuitry 112 configured to measure a second measurement system frequency (second frequency measurement value) f$_b$ of a voltage, which is opposite or reverse in phase or polarity to the commercial system voltage e$_{uw}$ (line-to-line voltage) from the W-phase to the U-phase, based on the period between adjacent leading edges of the rectangular wave output from the inversion circuitry 110. Note that in the example shown in FIG. 6A, the combination of the zero-crossing detection circuitry 11A and the first frequency measurement circuitry 111 corresponds to the claimed "first frequency measurement circuitry", while the combination of the zero-crossing detection circuitry 11A, the inversion circuitry 110 and the second frequency measurement circuitry 112 corresponds to the claimed "second frequency measurement circuitry". A frequency deviation Δf$_{grid}$ obtained based on the first measurement system frequency f$_a$ measured by the first frequency measurement circuitry 111 is input to the frequency responsive reactive power injection amount calculation circuitry 20 to calculate an amount of reactive power injection, while the first measurement system frequency f$_a$ measured by the first frequency measurement circuitry 111 and the second measurement system frequency f$_b$, which is measured, by the second frequency measurement circuitry 112, at a time shifted by a half cycle from the time when the first measurement system frequency f$_a$ is measured, are input to the islanding operation detection circuitry 24, so as to determine whether or not the solar cell power generator 100 is in islanding mode.

In FIG. 6B, the commercial system frequency measurement circuitry 11 comprises: a zero-crossing detection circuitry 11A; a first frequency measurement circuitry 111 configured to measure a first measurement system frequency f$_a$ of the commercial system voltage e$_{uw}$ from the U-phase to the W-phase based on the period between adjacent leading edges of the rectangular wave output from the zero-crossing detection circuitry 11A; and a second frequency measurement circuitry 112 configured to receive an input of a waveform data obtained by inverting the sign of a waveform data, which in turn is obtained by A/D (Analog-to-Digital) converting a divided voltage signal of the commercial system voltage e$_{uw}$, and to subject the input waveform data to PLL (Phase Locked Loop) operation to measure a second measurement system frequency f$_b$ of a signal which is shifted by a half cycle from the divided voltage signal of the commercial system voltage e$_{uw}$. Note that in the example shown in FIG. 6B, the combination of the zero-crossing detection circuitry 11A and the first frequency measurement circuitry 111 corresponds to the claimed "first frequency measurement circuitry".

In FIG. 6C, the commercial system frequency measurement circuitry 11 comprises: a first frequency measurement circuitry 111 configured to receive an input of a waveform data obtained by A/D converting a divided voltage signal of the commercial system voltage $e_{uw}$, and further configured to subject the input waveform data to PLL operation to measure a first measurement system frequency $f_a$ of the commercial system voltage $e_{uw}$; and a second frequency measurement circuitry 112 configured to receive an input of a waveform data obtained by inverting the sign of a waveform data, which in turn is obtained by A/D converting a divided voltage signal of the commercial system voltage $e_{uw}$, and further configured to subject the input waveform data to PLL operation to measure a second measurement system frequency $f_b$ of a signal which is shifted by a half cycle from the divided voltage signal of the commercial system voltage $e_{uw}$. The first frequency measurement circuitry 111 has an operation block configured to perform the PLL operation, while the first PLL circuitry 12 can be used as the operation block.

In the following, the operation of the islanding operation detection circuitry 24 will be described in detail. The islanding operation detection circuitry 24 determines that the solar cell power generator 100 is in islanding mode if the islanding operation detection circuitry 24 detects an abrupt change in the first and second measurement system frequencies $f_a$ and $f_b$ when the commercial system voltage $e_{uw}$ is normal (202±10V). As described above, the first frequency measurement circuitry 111 measures values of the first measurement system frequency $f_a$, while the second frequency measurement circuitry 112 measures values of the second measurement system frequency $f_b$ at a time shifted by a half cycle from the time when the first measurement system frequency $f_a$ is measured. The islanding operation detection circuitry 24 is designed so that at least based on current values of $f_a$ and $f_b$ at the current time, values of $f_a$ and $f_b$ at the time preceding the current time by one cycle (period), and values of $f_a$ and $f_b$ at the time preceding the current time by two cycles (periods), the islanding operation detection circuitry 24 determines whether or not the solar cell power generator 100 is in islanding mode.

More specifically, as shown in Equation set 3 below, an average value $f_{a.avr}$ of the first measurement system frequency $f_a$ from the U-phase to the W-phase and an average value $f_{b.avr}$ of the second measurement system frequency $f_b$ from the W-phase to the U-phase for a preceding duration of (y−x+1) cycles are calculated. Then, a multiplication product $\Delta f_{var}$ (total frequency change) of deviations of the current value $f_a$ (z), the first preceding value $f_a$ (z−1) to the n-th preceding value $f_a$ (z−n) from the average value $f_{a.avr}$ and deviations of the current value $f_b$ (z), the first preceding value $f_b$ (z−1) to the n-th preceding value $f_b$ (z−n) from the average value $f_{b.avr}$ is calculated. It is possible to determine that the solar cell power generator 100 is in islanding mode if the absolute value of the multiplication product of deviations $\Delta f_{var}$ is equal to or higher than a predetermined threshold K, and that the solar cell power generator 100 is normal if the absolute value of the multiplication product of deviations $\Delta f_{var}$ is lower than the threshold K. Note that in the present exemplary embodiment, n is set to n=2, and the time required by the islanding operation detection circuitry to detect the islanding operation mode is 3.5 cycles at maximum (n=2).

Further, the use of the determination method indicated by Equation set 3 can easily avoid an unnecessary detect even if an abrupt change occurs due to an instantaneous voltage drop shown in FIG. 5B. This is because upon an instantaneous voltage drop, the deviation of the commercial system frequency is most unlikely to be higher than the threshold K for n cycles or more. Here, it is preferable to set the value of the threshold K in the range of 4 to 9% of the frequency of the fundamental wave such that if, for example, the commercial system frequency is 50 Hz, it is preferable to set K in the range of 2.0 to 4.5.

[Equation 3 set]

$$f_{a.avr} = \frac{1}{(y-x+1)} \sum_{n=x}^{y} f_a(z-n)$$

$$f_{b.avr} = \frac{1}{(y-x+1)} \sum_{n=x}^{y} f_b(z-n)$$

$$\Delta f_{var} = \frac{1}{K}[f_{a.avr} - f_a(z)] \cdot [f_{a.avr} - f_a(z-1)] \cdot \ldots \cdot$$

$$[f_{a.avr} - f_a(z-n)] \cdot [f_{b.avr} - f_b(z)] \cdot$$

$$[f_{b.avr} - f_b(z-1)] \cdot \ldots \cdot [f_{b.avr} - f_b(z-n)]$$

If $|\Delta f_{var}| \geq K \Rightarrow$ Islanding operation mode

Otherwise $\Rightarrow$ Normal

Note that in the present exemplary embodiment, for calculating the average values $f_{a.avr}$, $f_{b.avr}$ of the first and second measurement system frequencies $f_a$, $f_b$ for the preceding duration, the time preceding the current time by x cycles is used as a reference time such that the average values $f_{a.avr}$, $f_{b.avr}$ of the first and second measurement system frequencies $f_a$, $f_b$ are calculated for the duration of (y−x+1) cycles preceding the reference time. Also note that in the present exemplary embodiment, x and y are set to x=32 and y=63.

FIG. 8 is a schematic diagram for explaining waveforms from the occurrence of an islanding operation to the detection of the islanding operation, showing an example of such waveforms. When the islanding operation mode occurs, the islanding operation detection device 10 operates based on the Standard of JEM 1498 such that 3 cycles after the occurrence of the islanding operation, the islanding operation detection device 10 starts the step reactive power injection, and then performs the frequency responsive (frequency feedback) reactive power injection. Here, the islanding operation detection device 10 injects a reactive current based on a reactive current command value updated each half cycle (period) of the commercial system voltage after the start of the step reactive power injection, and checks a change in the commercial system frequency each such half cycle.

As a result of the reactive power injection, the first measurement system frequency $f_a$ from the U-phase to the W-phase and the second measurement system frequency $f_b$ from the W-phase to the U-phase decrease. Thus, 3.5 cycles after the reactive power injection, the islanding operation detection device 10 can detect the islanding operation. FIG. 8 also shows that 0.25 cycle after the last frequency feedback reactive power injection, the islanding operation is detected to stop the grid-connected operation of the solar cell power generator 100. In other words, the time difference between when the reactive power corresponding to the calculated amount of reactive power is completely injected and when the islanding operation of the solar cell power generator 100 is detected is 0.25 cycle of the commercial system frequency.

Each of FIGS. 9A and 9B is a schematic diagram of a change in the commercial system frequency with time when the reactive current is injected, showing typical characteristics of change in the commercial system frequency after the occurrence of islanding operation. FIG. 9A shows a characteristic in which due to the injection of reactive current, the first measurement system frequency $f_a$ becomes lower than the average value $f_{a.avr}$ of the first measurement system frequency $f_a$, while FIG. 9B shows a characteristic in which due to the injection of reactive current, the first measurement system frequency $f_a$ increases once and then decreases.

Depending on a change in the amount of frequency deviation, the reactive current to be injected may be changed from a leading reactive current to a lagging reactive current by an algorithm for the frequency feedback reactive power injection. In the present exemplary embodiment, the commercial system frequency is likely to change like the change shown in FIG. 9B, for example, when due to the reactive current injection to be performed each half cycle, the waveform of the commercial system voltage is asymmetric between the first and second halves of the waveform with respect to a phase angle ($\theta_{uw}$) of 180° such that the time duration of the first half of the waveform is different from that of the second half of the waveform. Note, however, that even in this case, the islanding operation detection device 10 can detect a change in the commercial system frequency each half cycle (period), and therefore can detect per half cycle of the commercial system frequency whether or not the solar cell power generator 100 is in islanding mode.

FIG. 10 is a schematic block diagram for explaining an example of construction in which the polarity of the commercial system voltage is connected in reverse by mistake, showing a power conditioner PCS (1) connected to the commercial system power supply with normal polarity and a power conditioner PCS (2) connected to the commercial system power supply with reverse polarity by mistake during construction. The power conditioners PCS (1) and PCS (2) are the same except for the polarity of the connection to the commercial system power supply. Here, the fact that the power conditioner PCS (1) or PCS (2) is connected to the commercial power system supply with normal or reverse polarity means that the solar cell power generator 100 as a distributed power supply is connected to the commercial system power supply with normal or reverse polarity.

Assuming that a number of distributed power supplies including the power conditioners PCS (1) and PCS (2) are grid-connected to the commercial system power supply to operate, both the power conditioner PCS (1) and the power conditioner PCS (2), which are connected with reverse polarity to the commercial system power supply (from the W-phase to the U-phase) like this, can determine substantially at the same time whether or not the solar cell power generator 100 therein is in islanding mode.

It is to be noted that the islanding operation detection device 10 according to the exemplary embodiment of the present invention performs an islanding operation detection method described above. More specifically, in the islanding operation detection device 10, the commercial system frequency measurement circuitry 11 performs a commercial system frequency measurement step for measuring the commercial system frequency based on zero-crossing timing of the commercial system voltage $e_{uw}$, while the frequency responsive reactive power injection amount calculation circuitry 20 and the step reactive power injection amount calculation circuitry 21 perform a reactive power injection amount calculation step for calculating an amount of reactive power injection in response to a frequency deviation obtained based on the commercial system frequency measured by the commercial system frequency measurement step.

Further, the first PLL circuitry 12 performs a first PLL processing step for receiving an input of the commercial system voltage $e_{uw}$ and generating a reference system voltage signal synchronized with a phase angle ($\theta_{uw}$) of the commercial system voltage $e_{uw}$, and the second PLL circuitry 13 performs a second PLL processing step for receiving an input of a reverse power flow current $i_{sp}$ and generating a reference reverse power flow current signal synchronized with a phase angle $\theta_{sp}$ of the reverse power flow current $i_{sp}$, while the feedback signal generation circuitry 14 performs a feedback signal generation step for generating a feedback signal based on a phase difference ($\theta_m - \theta_{sp}$) between the commercial system voltage $e_{uw}$ and the reverse power flow current $i_{sp}$.

Further, the reactive current control circuitry 15 performs a reactive current control step for feedback-controlling an output current command value to the inverter to inject a target amount of reactive power injection from the inverter based on a reactive current command value corresponding to the amount of reactive power injection as calculated by the reactive power injection amount calculation step, and based on a feedback signal generated by the feedback signal generation step.

Further, the output current control circuitry 19 performs an output current control step for controlling the output current value of the inverter to follow the output current command value. The reactive current control step updates the reactive current command value when the phase angle ($\theta_{uw}$) of the commercial system voltage ($e_{uw}$) is in the range of 90N°±Δφ where N is an odd integer and Δφ≤φ$_{th}$ (threshold) so as to control the output current value of the inverter to follow the output current command value. Furthermore, the islanding operation detection circuitry 24 performs an islanding operation detection step which detects whether or not the solar cell power generator 100 is in islanding mode, based on a commercial system frequency of the commercial system power supply when the reactive power corresponding to the calculated amount (target amount) of reactive power injection is injected.

The commercial system frequency measurement step comprises a first frequency measurement step for measuring a first measurement system frequency $f_a$ of the commercial system voltage from the U-phase to the W-phase and a second frequency measurement step for measuring a second measurement system frequency $f_b$ of the commercial system voltage from the W-phase to the U-phase. The islanding operation detection step is configured to detect whether or not the solar cell power generator 100 is in islanding mode, based on values of the first measurement system frequency $f_a$ and the second measurement system frequency $f_b$ which is shifted by a half cycle, from current values of $f_a$ and $f_b$ at the current time, values of $f_a$ and $f_b$ at the time preceding the current time by one cycle to values of $f_a$ and $f_b$ at the time preceding the current time by n cycles.

It is to be noted that the present invention is not limited to the above-described exemplary embodiment, and various modifications are possible within the spirit and scope of the present invention. For example, the exemplary embodiment describes only an example of the islanding operation detection device and the islanding operation detection method for a distributed power supply according to the present invention, and it is needless to say that specific configurations (hardware and software) and various values used in the various configuration blocks can be designed and modified as appropriate as long as the function and effect of the present invention can be obtained. Such various modifications will become obvious, evident or apparent to those ordinarily skilled in the art, who have read the description. Accordingly, the appended claims should be interpreted to cover all modifications and alterations which fall within the spirit and scope of the present invention.

The invention claimed is:

1. An islanding operation detection device for at least one distributed power supply comprising an inverter grid-connected to a commercial system power supply, the islanding operation detection device comprising:
   a commercial system frequency measurement circuitry configured to measure a commercial system frequency based on zero-crossing timing of a commercial system voltage;
   a reactive power injection amount calculation circuitry configured to calculate an amount of reactive power injection in response to a frequency deviation which is a difference between a value of the commercial system frequency measured by the commercial system frequency measurement circuitry and a reference value of the commercial system frequency;
   a feedback signal generation circuitry comprising a first PLL circuitry configured to receive an input of the commercial system voltage and generate a reference system voltage signal synchronized with a phase angle of the commercial system voltage, and a second PLL circuitry configured to receive an input of a reverse power flow current and generate a reference reverse power flow current signal synchronized with a phase angle of the reverse power flow current, so that the feedback signal generation circuitry generates a feedback signal based on a phase difference between the reference system voltage signal and the reference reverse power flow current signal;
   a reactive current control circuitry configured to feedback-control an output current command value to the inverter based on a reactive current command value corresponding to the amount of reactive power injection calculated by the reactive current injection amount calculation circuitry and also based on the feedback signal generated by the feedback signal generation circuitry so as to inject reactive power corresponding to the calculated amount of reactive power injection into the commercial system power supply from the inverter;
   an output current control circuitry configured to update the reactive current command value when the phase angle of the commercial system voltage is in the range of 90N°±Δφ where N is an odd integer and Δφ≤φ$_{th}$ (threshold) so as to control an output current value of the inverter to follow the output current command value; and
   an islanding operation detection circuitry configured to detect whether or not the at least one distributed power supply is in islanding mode, based on the commercial system frequency when the reactive power corresponding to the calculated amount of reactive power injection is injected.

2. The islanding operation detection device according to claim 1,
   wherein the commercial system frequency measurement circuitry comprises: a first frequency measurement circuitry configured to measure a first measurement system frequency of the commercial system voltage; and a second frequency measurement circuitry configured to measure a second measurement system frequency of a voltage which corresponds to and is opposite in phase to the commercial system voltage, in which the second measurement system frequency is measured at a time shifted by a half cycle from a time when the first measurement system frequency is measured, and
   wherein the islanding operation detection circuitry detects whether or not the at least one distributed power supply is in islanding mode, based on values of the first and second measurement system frequencies from current values of them at the current time, values of them at the time preceding the current time by one cycle to values of them at the time preceding the current time by n cycles where n≥2.

3. The islanding operation detection device according to claim 2,
   wherein the islanding operation detection device can detect the islanding operation mode of the at least one distributed power supply per half cycle of the commercial system frequency.

4. The islanding operation detection device according to claim 2,
   wherein the at least one distributed power supply comprises a plurality of distributed power supplies grid-connected to the commercial system power supply to be operable,
   wherein the islanding operation detection device is provided in each of the plurality of distributed power supplies, and
   wherein in the islanding operation detection circuitry, n is set so that the plurality of islanding operation detection devices can detect the islanding operation substantially at the same time, regardless of whether or not the each of the plurality of distributed power supplies provided with the islanding operation detection device itself is connected to the commercial system power supply with normal polarity.

5. The islanding operation detection device according to claim 1,
   wherein the time difference between when the reactive power corresponding to the calculated amount of reactive power is completely injected and when the islanding operation of the distributed power supply is detected is 0.25 cycle of the commercial system frequency.

6. An islanding operation detection method for a distributed power supply comprising an inverter grid-connected to a commercial system power supply, the islanding operation detection method comprising:
   a commercial system frequency measurement step for measuring a commercial system frequency based on zero-crossing timing of the commercial system voltage;
   a reactive power injection amount calculation step for calculating an amount of reactive power injection in response to a frequency deviation which is a difference between a value of the commercial system frequency measured by the commercial system frequency measurement step and a reference value of the commercial system frequency;
   a feedback signal generation step comprising a first PLL processing step for receiving an input of the commercial system voltage and generating a reference system voltage signal synchronized with a phase angle of the commercial system voltage, and a second PLL processing step for receiving an input of a reverse power flow current and generating a reference reverse power flow current signal synchronized with a phase angle of the reverse power flow current, so as to generate a feedback signal based on a phase difference between the reference system voltage signal and the reference reverse power flow current signal;

a reactive current control step for feedback-controlling an output current command value to the inverter based on a reactive current command value corresponding to the amount of reactive power injection calculated by the reactive current injection amount calculation step and also based on the feedback signal generated by the feedback signal generation step so as to inject reactive power corresponding to the calculated amount of reactive power injection into the commercial system power supply from the inverter;

an output current control step for updating the reactive current command value when the phase angle of the commercial system voltage is in the range of $90N° \pm \Delta\varphi$ where N is an odd integer and $\Delta\varphi \leq \varphi_{th}$ (threshold) so as to control an output current value of the inverter to follow the output current command value; and an islanding operation detection step for detecting whether or not the distributed power supply is in islanding mode, based on the commercial system frequency when the reactive power corresponding to the calculated amount of reactive power injection is injected.

7. The islanding operation detection method according to claim 6, wherein the commercial system frequency measurement step comprises: a first frequency measurement step for measuring a first measurement system frequency of the commercial system voltage; and a second frequency measurement step for measuring a second measurement system frequency of a voltage which corresponds to and is opposite in phase to the commercial system voltage, in which the second measurement system frequency is measured at a time shifted by a half cycle from a time when the first measurement system frequency is measured, and wherein the islanding operation detection step detects whether or not the distributed power supply is in islanding mode, based on values of the first and second measurement system frequencies from current values of them at the current time, values of them at the time preceding the current time by one cycle to values of them at the time preceding the current time by n cycles where $n \geq 2$.

* * * * *

UNITED STATES PATENT AND TRADEMARK OFFICE
CERTIFICATE OF CORRECTION

PATENT NO. : 9,977,094 B2
APPLICATION NO. : 15/401355
DATED : May 22, 2018
INVENTOR(S) : Lung et al.

Page 1 of 1

It is certified that error appears in the above-identified patent and that said Letters Patent is hereby corrected as shown below:

On the Title Page

Item (54) and in the Specification, Column 1 Lines 1-3 should read:
Islanding Operation Detection Device and Islanding Operation Detection Method Signed and Sealed this
Twenty-first Day of May, 2019

Andrei Iancu
*Director of the United States Patent and Trademark Office*